(12) United States Patent
Yamamoto et al.

(10) Patent No.: US 9,142,441 B2
(45) Date of Patent: Sep. 22, 2015

(54) METHOD OF MOUNTING A SEMICONDUCTOR WAFER WITH A SUPPORT BOARD ON A SUPPORTING ADHESIVE TAPE JOINED TO A RING FRAME

(71) Applicant: NITTO DENKO CORPORATION, Ibaraki-shi, Osaka (JP)

(72) Inventors: Masayuki Yamamoto, Kameyama (JP); Yasuji Kaneshima, Kameyama (JP); Naoki Ishii, Kameyama (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/057,637

(22) Filed: Oct. 18, 2013

(65) Prior Publication Data

US 2014/0113413 A1    Apr. 24, 2014

(30) Foreign Application Priority Data

Oct. 23, 2012 (JP) ................... 2012-233761

(51) Int. Cl.
*H01L 21/00* (2006.01)
*H01L 21/683* (2006.01)
*H01L 21/67* (2006.01)

(52) U.S. Cl.
CPC ...... *H01L 21/6835* (2013.01); *H01L 21/67132* (2013.01); *H01L 21/6836* (2013.01); *H01L 2221/68318* (2013.01); *H01L 2221/68327* (2013.01); *H01L 2221/68381* (2013.01); *H01L 2924/1305* (2013.01); *H01L 2924/13055* (2013.01); *H01L 2924/1461* (2013.01)

(58) Field of Classification Search
CPC ........................................ H01L 21/44
USPC ........................ 438/106, 118, 110
See application file for complete search history.

(56) References Cited

U.S. PATENT DOCUMENTS

| 7,452,787 B2 * | 11/2008 | Miyazaki et al. ............. 438/464 |
| 2001/0049160 A1 * | 12/2001 | Watanabe et al. ............. 438/113 |
| 2002/0001688 A1 | 1/2002 | Ueda et al. |

(Continued)

FOREIGN PATENT DOCUMENTS

| JP | 2002-231765 A | 8/2002 |
| JP | 2006-319233 A | 11/2006 |

(Continued)

OTHER PUBLICATIONS

Notification of Reasons for Refusal for the Application No. 2012-233761 from Japan Patent Office mailed Sep. 3, 2013.

*Primary Examiner* — Caleb Henry
(74) *Attorney, Agent, or Firm* — Cheng Law Group, PLLC

(57) ABSTRACT

A resin sealing sheet is cut into an adhesive sheet piece having an outer shape smaller than that of a wafer. The adhesive sheet piece is joined to a supporting adhesive tape together with a ring frame. The adhesive tape between the ring frame and the adhesive sheet piece is sandwiched by upper and lower housings to form a chamber. The wafer with a support board placed on a wafer holding table within the chamber faces to the adhesive sheet piece closely. The chamber is divided into two spaces by the adhesive tape. Differential pressure generated within the two spaces causes the adhesive tape and the adhesive sheet piece to cave and bend toward the wafer, whereby the adhesive sheet piece is joined to the wafer.

5 Claims, 19 Drawing Sheets

(56) References Cited

U.S. PATENT DOCUMENTS

| | | | |
|---|---|---|---|
| 2002/0187589 A1* | 12/2002 | Tsujimoto | 438/118 |
| 2003/0064592 A1* | 4/2003 | Yamamoto | 438/689 |
| 2003/0235937 A1* | 12/2003 | Mong et al. | 438/106 |
| 2005/0101103 A1* | 5/2005 | Yamamoto | 438/455 |
| 2008/0296733 A1 | 12/2008 | Kizaki et al. | |
| 2009/0090451 A1* | 4/2009 | Yamamoto et al. | 156/64 |
| 2010/0248452 A1* | 9/2010 | Saito et al. | 438/464 |
| 2010/0300612 A1 | 12/2010 | Yamamoto et al. | |
| 2011/0236171 A1* | 9/2011 | Yamamoto et al. | 414/752.1 |

FOREIGN PATENT DOCUMENTS

| | | |
|---|---|---|
| JP | 2008-300521 A | 12/2008 |
| JP | 4438973 B2 | 3/2010 |
| JP | 2010-278065 A | 12/2010 |

\* cited by examiner

Fig.10
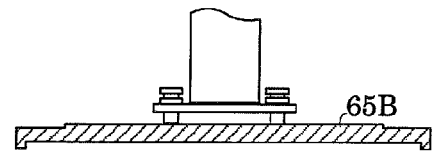
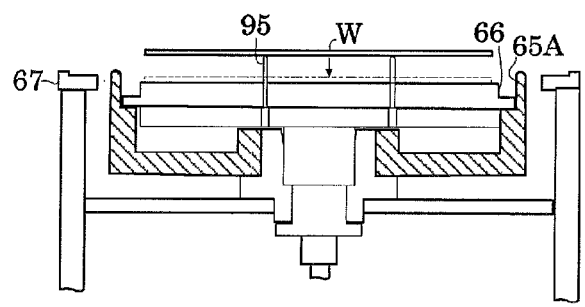
Fig.11
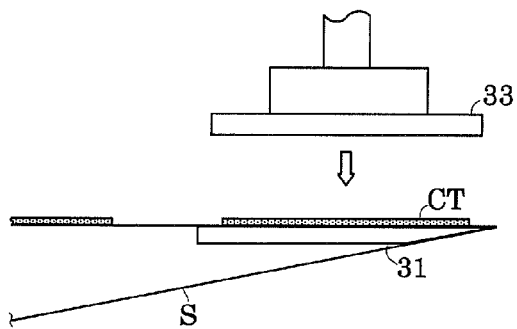
Fig.12
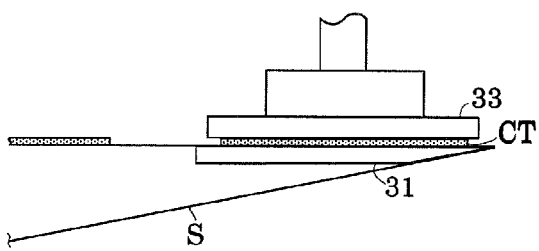

METHOD OF MOUNTING A SEMICONDUCTOR WAFER WITH A SUPPORT BOARD ON A SUPPORTING ADHESIVE TAPE JOINED TO A RING FRAME

TECHNICAL FIELD

The present invention relates to a semiconductor wafer mounting method and a semiconductor wafer mounting apparatus for mounting a semiconductor wafer on a ring frame via a supporting adhesive tape. More particularly, the present invention is directed to techniques of mounting a semiconductor wafer with protruding electrodes formed on a rear face thereof on an adhesive tape via a connection reinforcing sheet between the semiconductor wafer and the adhesive tape.

BACKGROUND ART

A common semiconductor device has protruding electrodes on a principal surface (rear face) to be mounted on a circuit board. The protruding electrodes are formed, for example, by solder balls or bumps.

In mounting the semiconductor device on the electrodes of the circuit board, a film-type underfill material is joined to a wafer. The film-type underfill material is used as a sheet for joining the semiconductor device to a mount position of the circuit board. Thereafter, each diced semiconductor element is placed on the film-type underfill material and is pressed, thereby being mounted on the circuit board. See Japanese Patent Publication No. 2002-231765A and Japanese Patent No. 4438973.

SUMMARY OF INVENTION

Technical Problem

The conventional method, however, has the following problem.

In recent years, a package such as TSV (Through-Silicon Via), IGBT (Insulated Gate Bipolar Transistor), and MEMS (Micro Electro Mechanical System), needs fine division of a circuit on the rear face of the semiconductor wafer (hereinunder, referred to as a "wafer" where appropriate) containing bumps having narrower pitches and higher level than the conventional bumps. The fine division causes a thinner semiconductor wafer.

In mounting diced chips on the film-type underfill material joined to the circuit board, the film-type underfill material cannot enter into the bumps of narrow and small pitches completely. This may catch air bubbles. In addition, heating of the film-type underfill material in this condition for softening causes the air bubbles to expand. That is, chips float to trigger contact failure. Such a problem may arise.

To this end, for overcoming the problem, Inventors have tested joining in advance of the film-type underfill material on the rear face of the wafer larger than the chip and easy to use.

In addition, thinning the wafer leads to decreased wafer rigidity. Then, joining a supporting plate to the wafer via a resin adhesive agent or adhesive tape allows reinforcing the wafer, the supporting plate being made of glass, for example, and larger than an outer shape of the wafer.

However, when the wafer is joined to the resin adhesive agent, the adhesive agent likely protrudes from an outer periphery of the wafer. Shifting a joining position of the film-type underfill material cut into a wafer shape under this condition may generate separation errors. Specifically, when the film-type underfill material is joined to the adhesive agent, the supporting plate, or both of them, excessive tension acts on the periphery edge of the wafer during separating the adhesive agents from the supporting plate or from the wafer. That is, such tension causes damages on the edge of the wafer. Such a new problem may arise.

The present invention has been made regarding the state of the art noted above, and its primary object is to provide a semiconductor wafer mounting method and a semiconductor wafer mounting apparatus that allow accurate mounting of a semiconductor wafer having protruding electrodes formed thereon on a ring frame via a reinforcing adhesive sheet between the semiconductor wafer and an adhesive tape, thereby manufacturing a mount frame having a conforming semiconductor wafer mounted thereon.

Solution to Problem

To this end, the present invention adopts the following construction.

One aspect of the present invention discloses a semiconductor wafer mounting method of mounting a semiconductor wafer with a support board on a supporting adhesive tape joined to a ring frame by inserting a reinforcing adhesive sheet between a surface of the semiconductor wafer with protruding electrodes formed thereon and the supporting adhesive tape. The method includes drawing the adhesive tape and joining the adhesive tape to the ring frame, and thereafter mounting the semiconductor wafer on the adhesive tape by inserting the adhesive sheet having an outer shape equal to or smaller than that of the semiconductor wafer between the semiconductor wafer and the adhesive tape.

In the above method, the reinforcing adhesive sheet has an outer shape equal to or smaller than that of the semiconductor wafer. Accordingly no adhesive sheet protrudes from the semiconductor wafer. That is, no adhesive sheet protrudes from the semiconductor wafer and adheres to an adhesive layer joining the semiconductor wafer and the support board or to the support board. Consequently, no excessive tension acts on the periphery edge of the semiconductor wafer upon separating the support board or the adhesive layer from the semiconductor wafer. This avoids damages in the semiconductor wafer.

In addition, the semiconductor wafer thinned through a back grinding process has a surface entirely reinforced by the support board. Consequently, the support board disperses pressure applied to the adhesive sheet against the semiconductor wafer to obtain uniformed pressure. In other words, the semiconductor wafer can be joined to the adhesive sheet while pressure is applied to the semiconductor wafer higher than the pressure applied to the adhesive sheet against single chip held with a suction collet for mounting. Consequently, the adhesive sheet can be brought into adhesion on the protruding electrodes. In other words, catching air bubbles between the protruding electrodes can be suppressed. As a result, even when the chips divided through the dicing process are mounted on the circuit board and heated, suppression in electrical contact failure resulting from expansion of the air bubbles can be achieved.

In addition, the adhesive tape is drawn so as not to be in plastic deformation upon joining to the ring frame. This causes no generation of unnecessary wrinkles in the adhesive tape exposed between an internal diameter of the ring frame and the semiconductor wafer upon joining the adhesive sheet to the semiconductor wafer in subsequent processes.

Moreover, in the above method, when the adhesive sheet is smaller than the semiconductor wafer, the adhesive sheet is joined to the adhesive tape, and thereafter the adhesive sheet is joined together to the semiconductor wafer while being drawn together with the adhesive tape to have the same shape as the semiconductor wafer.

The above method achieves a one-time joining process upon mounting the semiconductor wafer to the adhesive tape. Consequently, stress due to pressure applied to the semiconductor wafer and the protruding electrodes decreases, and accordingly damages in the semiconductor wafer and the protruding electrodes can be suppressed.

Moreover, the adhesive sheet is drawn so as to have the same shape as the semiconductor wafer. This generates no gap between the adhesive tape and the periphery edge of the semiconductor wafer. Consequently, contamination of the semiconductor wafer upon the dicing process can be avoided resulting from dust particles or water entering between the adhesive tape and the semiconductor wafer during cutting. In addition, chip scattering can be eliminated occurring in the dicing process with the periphery edge of the semiconductor wafer not being covered with the adhesive sheet.

It is also preferable that a pair of housings sandwiches a portion of the adhesive tape joined to the ring frame between the ring frame and the semiconductor wafer, and that the adhesive sheet on the adhesive tape closely faces to the semiconductor wafer within a chamber formed by connecting both of the housings, and the adhesive sheet is joined to the semiconductor wafer with air pressure in a space within the chamber containing the semiconductor wafer being lower than that of the other space.

With this method, differential pressure is generated between the two spaces within the chamber. This causes the adhesive sheet together with the adhesive tape to cave and bend toward the space having lower air pressure. Specifically, the center of the caved and bent adhesive sheet contacts the center of the semiconductor wafer, and then the contacted center spreads radially. As a result, the adhesive sheet can be joined to the surface of the semiconductor wafer having the protruding electrodes formed thereon with high accuracy while air is surely discharged between the adhesive sheet and the semiconductor wafer.

The present invention also has the following construction to achieve the above object.

Another aspect of the present invention discloses a semiconductor wafer mounting method of mounting a semiconductor wafer with a support board on an adhesive tape via a reinforcing adhesive sheet between a surface of the semiconductor wafer with protruding electrodes formed thereon and a supporting adhesive tape joined to a ring frame. The method includes a first joining step of joining the adhesive sheet, having an outer shape smaller than an outer shape of the semiconductor wafer, to the adhesive tape; a second joining step of drawing the adhesive sheet together with the adhesive tape so as to have the outer shape of the semiconductor wafer and joining the adhesive sheet to the ring frame; and a mount step of mounting the semiconductor wafer on the adhesive tape by inserting the adhesive sheet between the semiconductor wafer and the adhesive tape.

The above method includes drawing the adhesive sheet together with the adhesive tape, and thus the reinforcing adhesive sheet has the outer shape equal to or smaller than that of the semiconductor wafer. This causes no necessity of drawing the adhesive sheet upon joining the adhesive sheet to the semiconductor wafer.

In the mount step, at least the semiconductor wafer is accommodated in the chamber, and the semiconductor wafer is mounted on the adhesive tape via the adhesive sheet while a joining member presses the adhesive tape under a reduced pressure.

The above method allows elimination of catching air bubbles on a contact interface between the adhesive sheet and the semiconductor wafer.

The present invention also adopts the following construction to achieve the above object.

Another aspect of the present invention discloses a semiconductor wafer mounting apparatus configured to mount a semiconductor wafer with a support board on a supporting adhesive tape joined to a ring frame by inserting a connection reinforcing adhesive sheet between a surface of the semiconductor wafer with protruding electrodes formed thereon and the supporting adhesive tape. The apparatus includes a sheet supply mechanism configured to supply the adhesive sheet having an outer shape equal to or smaller than an outer shape of the semiconductor wafer; a sheet holding mechanism configured to hold the adhesive sheet via a separator; a frame holding mechanism configured to hold the ring frame; a tape supply mechanism configured to supply the adhesive tape; a tension mechanism configured to apply tension to the adhesive tape; a first joining mechanism configured to join the adhesive tape to the ring frame held by the frame holding mechanism and the adhesive sheet held by the sheet holding mechanism, tension being applied to the adhesive tape by the tension mechanism; a separating mechanism configured to separate the separator from the adhesive sheet; a wafer holding table configured to hold the semiconductor wafer; a frame holding table configured to hold the ring frame having the adhesive tape with the adhesive sheet joined thereto; and a mount mechanism configured to mount the semiconductor wafer on the adhesive sheet.

Another aspect of the present invention discloses a semiconductor wafer mounting apparatus configured to mount a semiconductor wafer with a support board on a supporting adhesive tape joined to a ring frame with a reinforcing adhesive sheet interposed between a surface of the semiconductor wafer with protruding electrodes formed thereon and the adhesive tape. The apparatus includes a frame holding mechanism configured to hold the ring frame; a tape supply mechanism configured to supply the adhesive tape having the adhesive sheet joined thereto in advance, the adhesive tape having an outer shape smaller than an outer shape of the semiconductor wafer; a tension mechanism configured to apply tension to the adhesive tape; a first joining mechanism configured to join the adhesive tape to the ring frame held by the frame holding mechanism, tension being applied to the adhesive tape by the tension mechanism; a separating mechanism configured to separate the separator from the adhesive sheet; a wafer holding table configured to hold the semiconductor wafer; a frame holding table configured to hold the ring frame having the adhesive tape with the adhesive sheet joined thereto; and a mount mechanism configured to mount the semiconductor wafer on the adhesive sheet.

These constructions allows joining the reinforcing adhesive sheet, with outer shape equal to or smaller than that of the semiconductor wafer, to the surface of the semiconductor wafer with the protruding electrodes formed thereon. That is, these constructions allow suitably implementation of each of the above methods.

Moreover, the mount mechanism of the above apparatus may have the following construction.

The mount mechanism may include a chamber configured to accommodate the wafer holding table and formed by a pair of housings to sandwich the adhesive tape between the ring frame and the semiconductor wafer; and a second joining mechanism configured to generate differential pressure in two spaces into which the chamber is divided with the adhesive tape, and to join the adhesive sheet to the semiconductor wafer while the adhesive tape and the adhesive sheet cave and bend.

The mount mechanism may include a chamber formed by a pair of housings having an outer shape capable of accommodating at least the semiconductor wafer; and a second joining mechanism configured to join the adhesive sheet to the semiconductor wafer by pressing the adhesive tape with the joining member while reducing pressure within the chamber.

These constructions allow generation of the differential pressure between the two spaces divided by the adhesive tape to join the adhesive sheet to the semiconductor wafer together with the adhesive tape while the adhesive sheet and the adhesive tape cave and bend toward. Consequently, the adhesive sheet is joined to the semiconductor wafer radially from the center toward the outer periphery of the semiconductor wafer. This causes discharging air between the adhesive sheet and the semiconductor wafer. That is, catching air bubbles between the adhesive sheet and the semiconductor wafer can be suppressed. In addition, caving and bending of the adhesive sheet in the joining step allows the adhesive sheet to be drawn to have the same shape as the semiconductor wafer and to be joined.

Moreover, the adhesive sheet can be joined to the semiconductor wafer with no differential pressure in the chamber.

Advantageous Effects of Invention

The semiconductor wafer mounting method and the semiconductor wafer mounting apparatus according to the aspects of the present invention allow accurate joining of the supporting adhesive tape via the reinforcing adhesive sheet to the surface of the semiconductor wafer having the protruding electrodes formed thereon.

It is to be understood that both the foregoing general description and the following detailed description are exemplary and explanatory and are intended to provide further explanation of the invention as claimed.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIG. 10 illustrates placing the wafer on a wafer holding table.

FIGS. 11 to 13 each illustrate operations of producing an adhesive sheet piece.

DESCRIPTION OF EMBODIMENTS

Description will be given of embodiments of the present invention with reference to drawings.

<Semiconductor Wafer>

This embodiment will describe in detail a semiconductor wafer (hereinafter, simply referred to as a "wafer") that is joined to and held with a ring frame via a supporting adhesive tape (a dicing tape).

Figure 1:
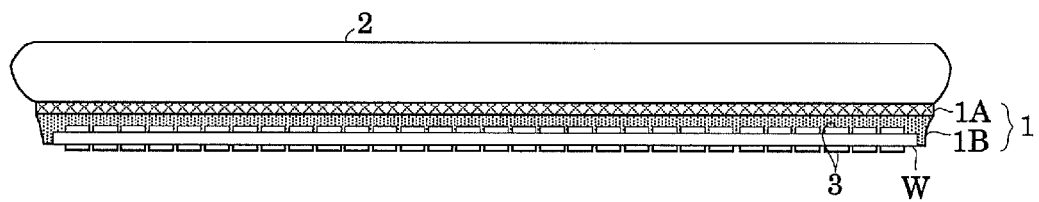
FIG. 1 is a longitudinal sectional view of a semiconductor wafer.
Figure 2:
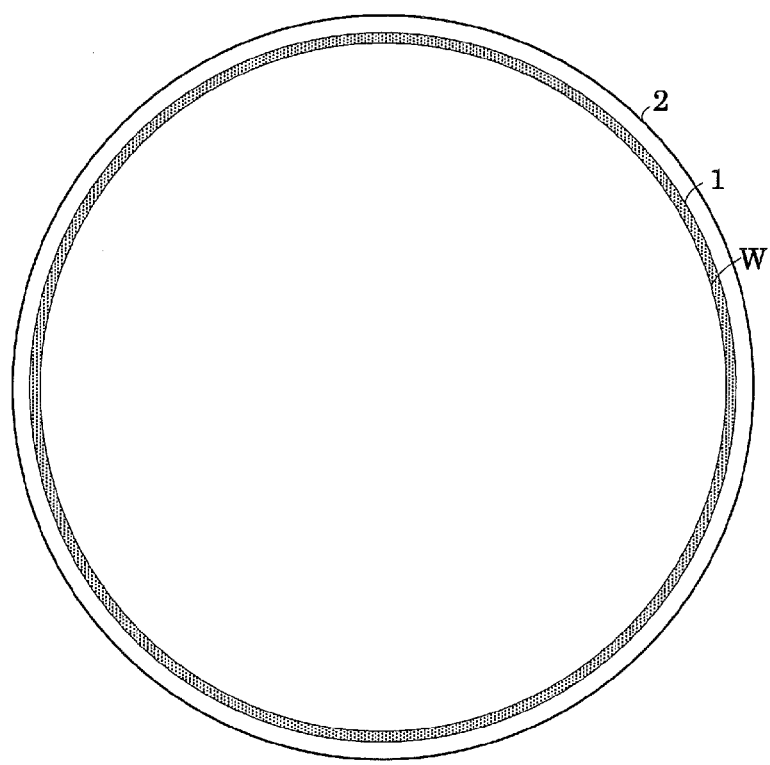
FIG. 2 is a bottom view of the semiconductor wafer.

FIG. 1 is a longitudinal sectional view of a semiconductor wafer according to the present invention. FIG. 2 is a bottom view thereof.

A reinforcing support board 2 is joined to a wafer W via an adhesive layer 1 composed of a plurality of layers. The wafer W has protruding electrodes 3, such as solder balls or bumps, on a rear face after a back grinding process and a surface thereof. For instance, the wafer W has a thickness of 100 µm or less. The protruding electrodes 3 each have a thickness and a pitch thereof of 100 µm.

The adhesive layer 1 is composed of a separation layer 1A and a liquid adhesive agent layer 1B. The separation layer 1A reduces an adhesive force through laser or heating. The adhesive agent layer 1B is applied to the separation layer 1A. The adhesive agent layer 1B is, for example, ultraviolet curable, and cures after being joined to the wafer W. Accordingly, since the adhesive agent layer 1B is uncured upon being joined to the wafer W, the adhesive agent layer 1B protrudes from a periphery edge of the wafer W although an adhesive agent enters among the protruding electrodes formed on the surface of the wafer W.

The support board 2 is composed of a glass or quartz larger than the outer shape of the wafer W.

<Semiconductor Wafer Mounting Apparatus>

Figure 3:
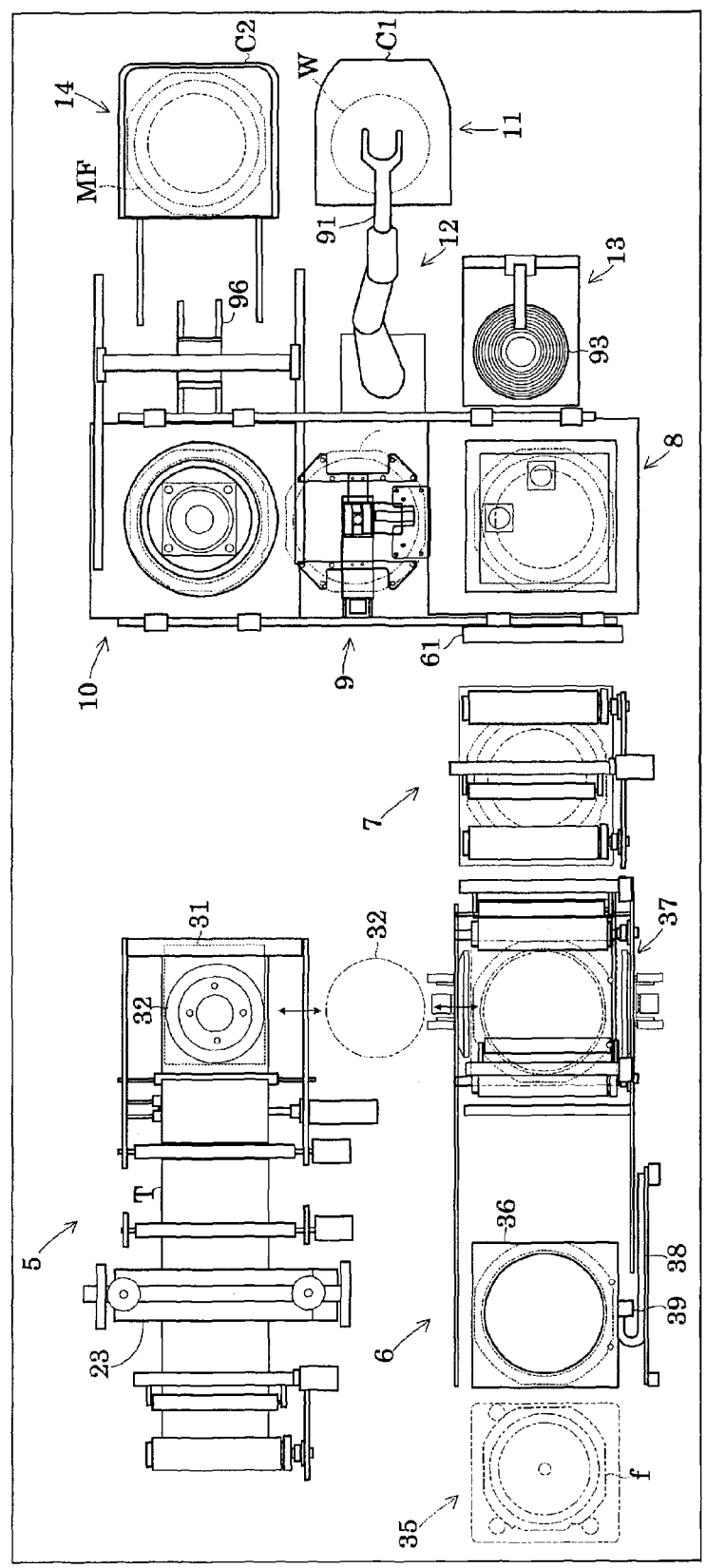
FIG. 3 is a plan view of a semiconductor wafer mounting apparatus.

FIG. 3 is a plan view of a semiconductor wafer mounting apparatus according to one embodiment of the present invention.

The mounting apparatus includes a sheet supplying section 5, an adhesive tape supplying section 6, a separator separating section 7, a frame aligner 8, a frame transport mechanism 9, a mount frame manufacturing section 10, a wafer supplying section 11, a wafer transport mechanism 12, a wafer aligner 13, and a frame collector 14. Each of the elements is to be described in detail.

Figure 4:
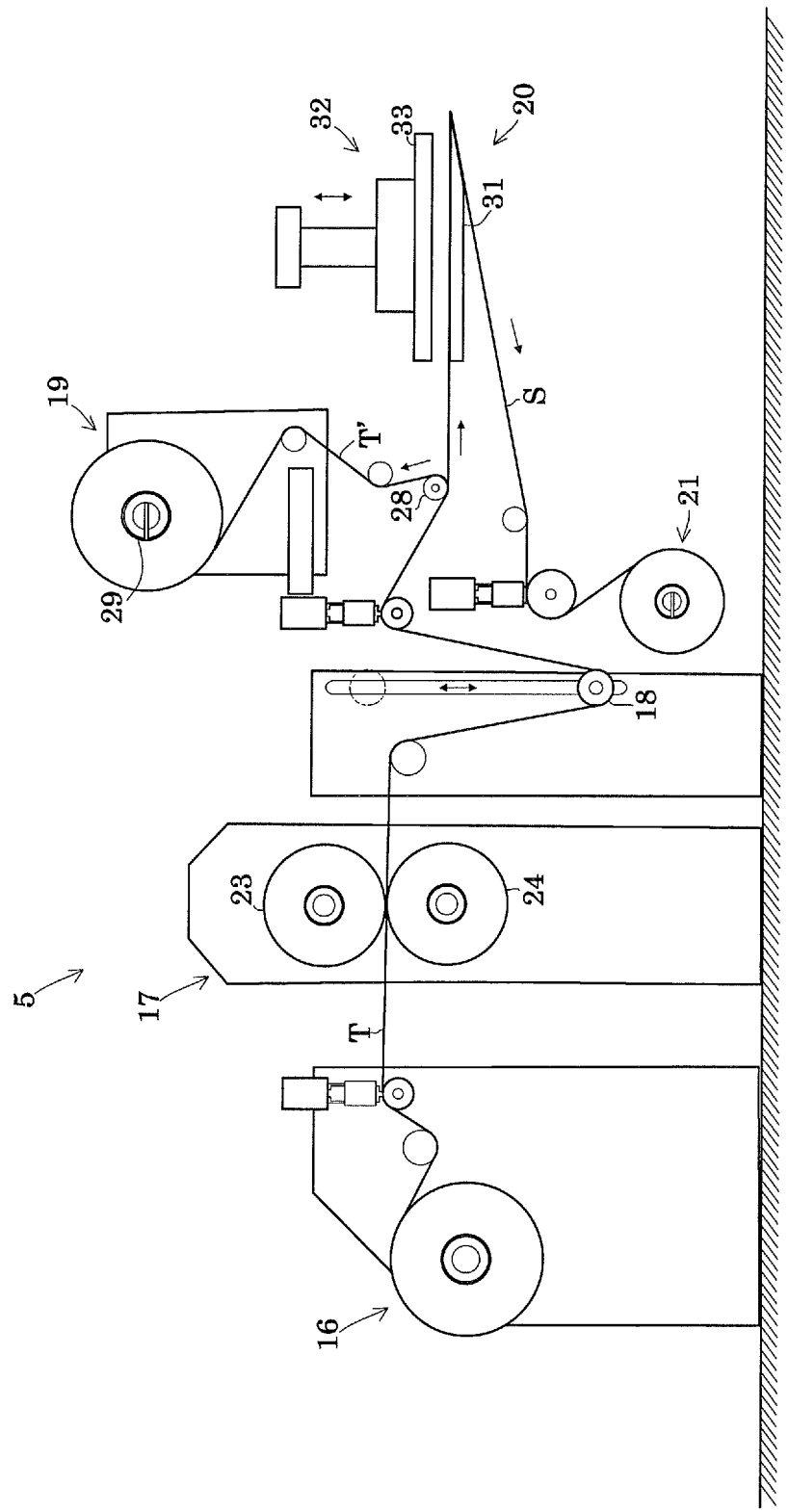
FIG. 4 is a front view of a sheet supplying section.

As illustrated in FIG. 4, the sheet supplying section 5 includes a sheet supply mechanism 16, a cutting mechanism 17, a dancer roller 18, an undesired sheet collecting mechanism 19, a sheet separating mechanism 20, and a separator collecting mechanism 21.

The sheet supply mechanism 16 includes a bobbin for attaching an original master roll formed by rolling the adhesive sheet T. The sheet supply mechanism 16 guides the adhesive sheet T unreeled from the original master roll on a given path via the dancer roller 18. The sheet cutting mechanism 16 supplies the adhesive sheet T via the sheet cutting mechanism 17 to the sheet separating mechanism 20.

The adhesive sheet T has a separator S attached to the surface and rear face thereof. The adhesive sheet T is composed of resin sealing between a surface of a chip on which the protruding electrodes 3 are formed and a mounting substrate. Here, the chip is made by dividing the wafer W in the dicing process. Examples of the adhesive sheet T include NCF (Non Conductive Film) in the form of a film-type underfill material with joining and insulating functions or ACF (Anisotropic Conductive Film) with conductivity.

Figure 5:
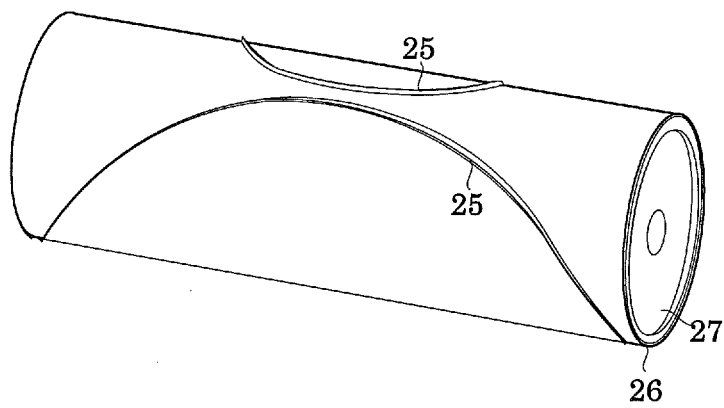
FIG. 5 is a perspective view of a cutting roller.

The cutting mechanism 17 includes a cutting roller 23 and a receiving roller 24. The rollers 23 and 24 drive in synchronization with each other and face each other vertically. As illustrated in FIG. 5, the cutting roller 23 includes a sheet 26 with a cutting edge 25. The sheet 26 is attached to the drive roller 27. The cutting edge 25 is annular for cutting the adhesive sheet T in a circular shape.

The receiving roller 24 is a drive roller made of metal. At least the cutting roller 23 or the receiving roller 24 is driven by a drive cylinder so as to move upward and downward. Consequently, a gap between the rollers 23 and 24 is variable in accordance with a thickness of the adhesive sheet T.

The undesired sheet collector 19 reels an undesired adhesive sheet T' separated from the separator S just behind the sheet feed roller 28 and collects the undesired adhesive sheet T to a collection bobbin 29. The undesired adhesive sheet T' is continuous with circular adhesive sheet pieces CT cut off on the separator S on the rear face. As a result, the separator S with the adhesive sheet piece CT is guided to the sheet separating mechanism 20.

As illustrated in FIG. 4, the sheet separating mechanism 20 is constituted by a separating member 31 and a suction transport mechanism 32.

The separating member 31 includes a flat surface that allows holding of the adhesive sheet piece CT horizontally. The separating member 31 is tapered at a tip end thereof. The separating member 31 folds the separator S at the tip end thereof and guides the separator S to the separator collecting mechanism 21.

The suction transport mechanism 32 includes a sheet suction table 33 whose diameter is equal to or larger than that of the adhesive sheet piece CT. The sheet suction table 33 moves vertically and horizontally. Specifically, the sheet suction table 33 moves between a standby position above the separating member 31 and a position where the adhesive sheet piece CT is suction-held on the separating member 31. Moreover, the sheet suction table 33 moves horizontally in a transport direction of the adhesive sheet T after suction-holding the adhesive sheet piece CT. In addition, the sheet suction table 33 suction-holds the adhesive sheet piece CT and moves to a joining position to the supporting adhesive tape DT adjacent to the adhesive tape supplying section 6, and also moves vertically at the joining position. Here, the sheet suction table 33 corresponds to the sheet holding mechanism in the present invention.

As illustrated in FIG. 2, the adhesive tape supplying section 6 includes a frame supplying section 35, a frame transport mechanism 36, and a tape joining mechanism 37.

The frame supplying section 35 includes a wagon-type guided vehicle connected to a space within the apparatus. The guided vehicle accommodates laminated ring frames f. The guided vehicle includes inside thereof an ascent/descent board. The ring frames f are laminated on the ascent/descent board. Consequently, the ascent/descent board delivers every ring frame f from an opening in an upper side thereof to the frame transport mechanism 36 while lifting at given pitches.

Figure 6:
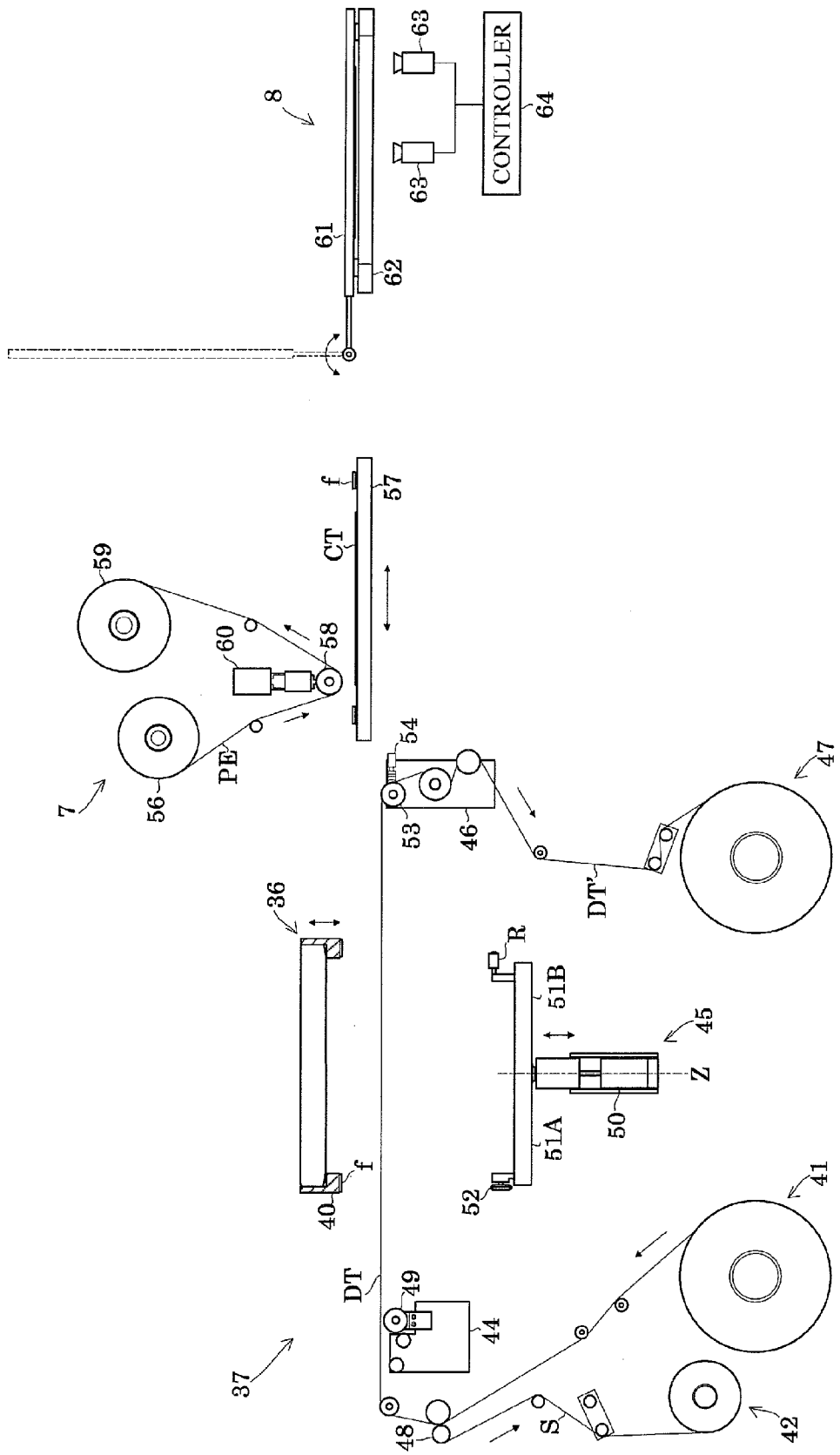
FIG. 6 is a front view of a tape supplying section.

The frame transport mechanism 36 includes a movable board 39, a suction portion 40, and an aligner. The movable board 39 reciprocates between the frame supplying section 35 and the joining position of the adhesive tape DT along a guide rail 38. The movable board 39 includes an arm, the suction portion 40, and the aligner. The arm moves vertically along an upright rail fixed to the movable board 39. As illustrated in FIG. 6, the suction portion 40 and the aligner are attached to a tip end of the arm.

The suction portion 40 is an annular plate. The suction portion 40 includes a plurality of suction pads on a lower surface thereof. The suction pads are b and directed downward. In other words, the ring frame f is suction-held by the suction pad, and is entirely held by the suction portion 40 in a planar state. The suction pad is capable of suction-holding the ring frame f having different sizes. That is, the suction portion 40 functions as a frame holding mechanism upon joining the adhesive tape DT.

The aligner is formed by a positioning engagement pin that is upright and directed downward so as to perform adjustment slidingly in the direction of the radius of the frame f.

Figure 15:
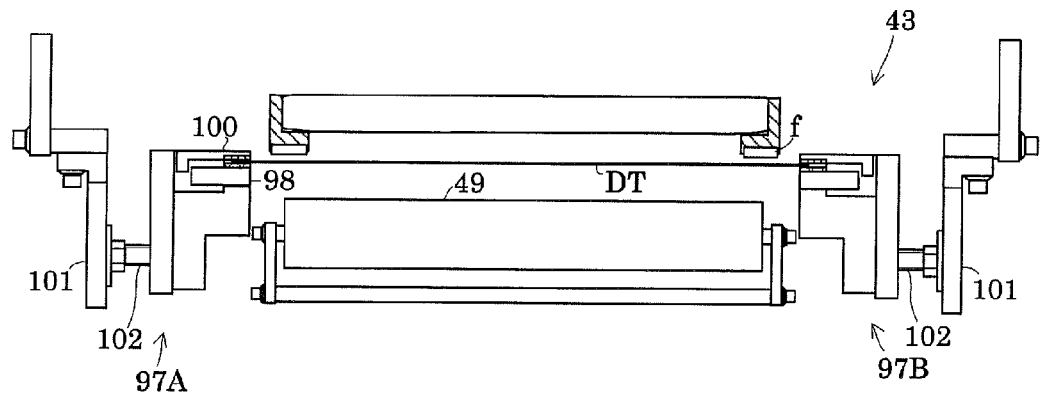
Figure 16:
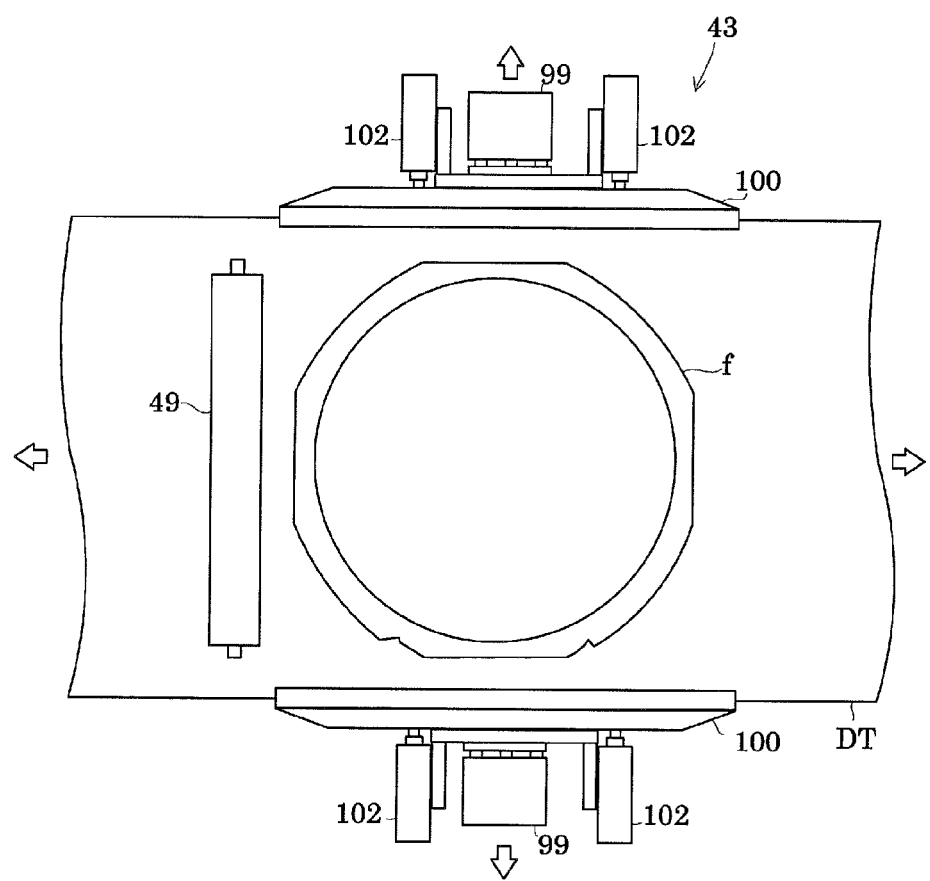

As illustrated in FIGS. 6, 15, and 16, the tape joining mechanism 37 includes a tape supplying section 41, a separator collector 42, a tension mechanism 43, a joining unit 44, a tape cutting mechanism 45, a separating unit 46, and a separation tape collector 46. The tape joining mechanism 37 corresponds to the first joining mechanism in the present invention.

The tape supplying section 41 houses the original master roll of the supporting adhesive tape DT in the bobbin. The adhesive tape DT unreeled from the tape supplying section 41 is guided to a pinch roller 47. The pinch roller 47 separates the separator S, and is reversed and guided downward. The adhesive tape DT has an adhesive surface exposed due to separation of the separator S, and is fed out horizontally. Thereafter, the adhesive tape DT is guided through the joining unit 44 to the separating unit 46.

The separator collector 42 reels and collects the separator S in synchronization with an unreeling speed of the adhesive tape DT by the tape supplying section 41.

As illustrated in FIGS. 15 and 16, the tension mechanism 43 is constituted by a pair of gripping mechanisms 97A and 97B across the adhesive tape DT.

The gripping mechanisms 97A and 97B each include a fixed receiving piece 98, a cylinder 99, and a movable piece 100. The cylinder 99 moves the movable piece 100 upward and downward. Accordingly, the movable piece 100 and the fixed receiving piece open and close. The gripping mechanisms 97A and 97B are attached to the support frame 101 via a cylinder 102, the support frame 101 being attached to the apparatus frame. That is, the gripping mechanisms 97A and 97B apply tension by pulling the gripped adhesive tape T in a width direction while the cylinder 102 expands and contracts.

The joining unit 44 reciprocates horizontally with a screw-feed type or belt type drive mechanism, not shown. The joining unit 44 further includes a joining roller 48 that allows upward and downward movement with a cylinder as illustrated in FIG. 6.

The tape cutting mechanism 45 moves vertically with an air cylinder 50. In addition, the tape cutting mechanism 45 includes a plurality of support arms 51A and 51B pivoting about the center axis Z. The arm 51A has a disk cutter 52 attached at one tip end thereof. The cutter 52 allows upward and downward movement via a cutter bracket pivotally supported horizontally. The support arm 51B has a press roller R attached at the other tip end thereof. The press roller R allows upward and downward movement via a swing arm.

The separation unit 46 allows reciprocating horizontally via a drive mechanism, not shown, of such as a screw-feed type or a belt type. The separation unit 46 also includes a separation roller 53 and a pusher 54. The separation roller 53 guides the adhesive tape DT guided out from the joining unit 43. The pusher 54 holds the adhesive tape DT so as to cooperate with the separation roller 53.

A tape collector 47 operates in synchronization with the separation unit 46. The tape collector 47 reels the undesired adhesive tape DT', cut into a circular shape by the tape cutting mechanism 45, to the bobbin and collects the adhesive tape DT'.

The separator separating mechanism 7 is constituted by a tape supplying section 56, a separation table 57, a separation roller 58, and a tape collector 59. The separator separating mechanism 7 corresponds to the separating mechanism in the present invention.

The tape supplying section 56 houses the original master roll of a separation tape PE in the bobbin. The separation tape PE has a width narrower than the diameter of the adhesive sheet T. The separation tape PE unreeled from the tape supplying section 56 is guided to the separation roller 58.

The separation table 57 is a plate and suction-holds the ring frame fin a planar state. The separation table 57 reciprocates between the joining position of the adhesive tape DT and a delivery position to the frame aligner 8 from a separation position of the adhesive sheet piece CT as a starting point.

The separation roller 58 can be moved upward and downward with an air cylinder 60. Specifically, the separation tape PE is joined to the separator S attached to the surface of the adhesive sheet piece CT on the separation table 57, the separation table 57 suction-holding the ring frame f having the adhesive sheet piece CT joined to the adhesive tape DT.

The tape collector 59 reels and collects the separation tape PE with the separator S in synchronization with unreeling of the separation tape PE by the tape supplying section 56 and separating the separator S.

The frame aligner 8 is constituted by a reversing arm 61, an alignment stage 62, and an optical sensor 63.

The reversing arm 61 includes an annular suction plate at a tip end thereof. The suction plate swings about an axis. Specifically, the reversing arm 61 suction-holds the outer periphery of the ring frame f on the separation table 57 and reverses the ring frame f, and thereafter holds the ring frame f horizontally on the alignment stage 62.

The alignment stage 62 is annular and holds a periphery edge of the ring frame f, which is similar to the suction plate of the reversing arm 61. Here, the ring frame f is held with the surface thereof directed downward, the surface having the adhesive sheet piece CT joined thereto.

The optical sensor 63 corresponds to an imaging apparatus in this embodiment. Two optical sensors 63 image the ring frame f and the adhesive sheet piece CT, respectively, to obtain image data. The obtained image data is sent to a controller 64. The controller 64 performs pattern matching between the obtained image data and a reference image to calculate a deviation amount of the reference image and the obtained image. The reference image is determined in advance from a profile image of an internal diameter of the ring frame f and a profile image of the adhesive sheet piece CT.

The frame transport mechanism 9 illustrated in FIG. 3 suction-holds the ring frame f with a plurality of suction pads.

Figure 7:
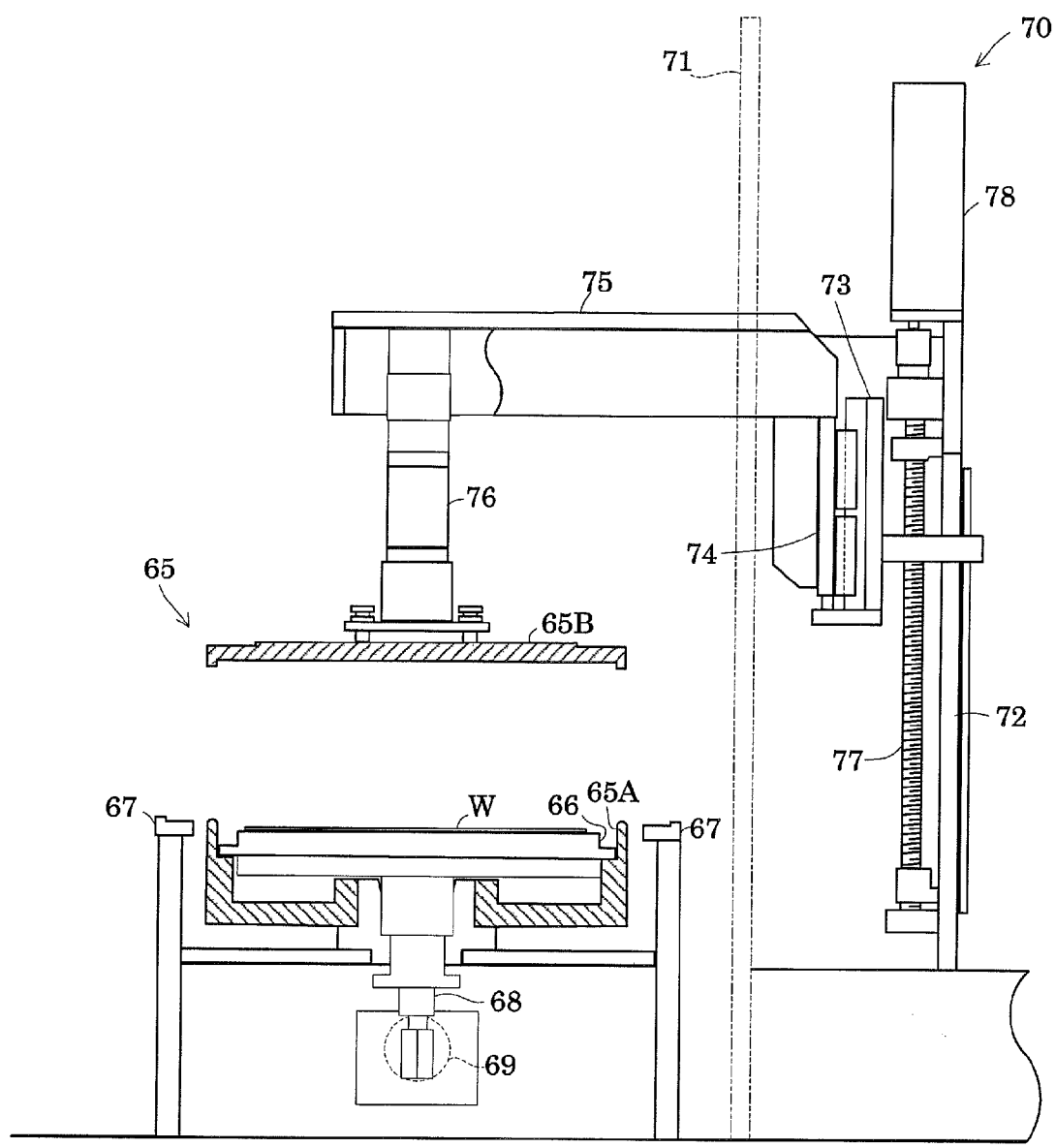
FIG. 7 is a vertical sectional view of a mount frame manufacturing section.

As illustrated in FIG. 7, the mount frame producing section 10 is constituted by a chamber 65, a wafer holding table 66, and a frame holding table 67. These mechanisms constituting the mount frame producing section 10 function as the mount mechanism in the present invention.

The chamber 65 is formed by a pair of lower and upper housings 65A and 65B. The housings each have an outer shape smaller than the internal diameter of the ring frame f.

Inside the housing 65A, a wafer holding table 66 is provided that allows upward and downward movement. The wafer holding table 66 includes a suction block configured to suction-hold the wafer W with the support board. The wafer holding table 66 is connected to one end of a rod 68 passing through the lower housing 65A. The other end of the rod 68 is drivingly connected to an actuator 69 composed of a motor, for example. As a result, the wafer holding table 66 moves upward and downward within the lower housing 65A.

The upper housing 65B is provided in a lifting drive mechanism 70. The lifting drive mechanism 70 includes a movable board 73, a movable frame 74, and an arm 75. The movable board 73 moves upward and downward along a rail 72 behind an upright wall 71. The movable frame 74 is adjustably supported on the movable board 73. The arm extends forward from the movable frame 74. The upper housing 65B is attached to a shaft 76 extending downward from a tip end of the arm 75. The movable board 73 moves upward and downward in a screw-feed manner by rotating a screw shaft 77 with a motor 78 forward/backward.

Figure 8:
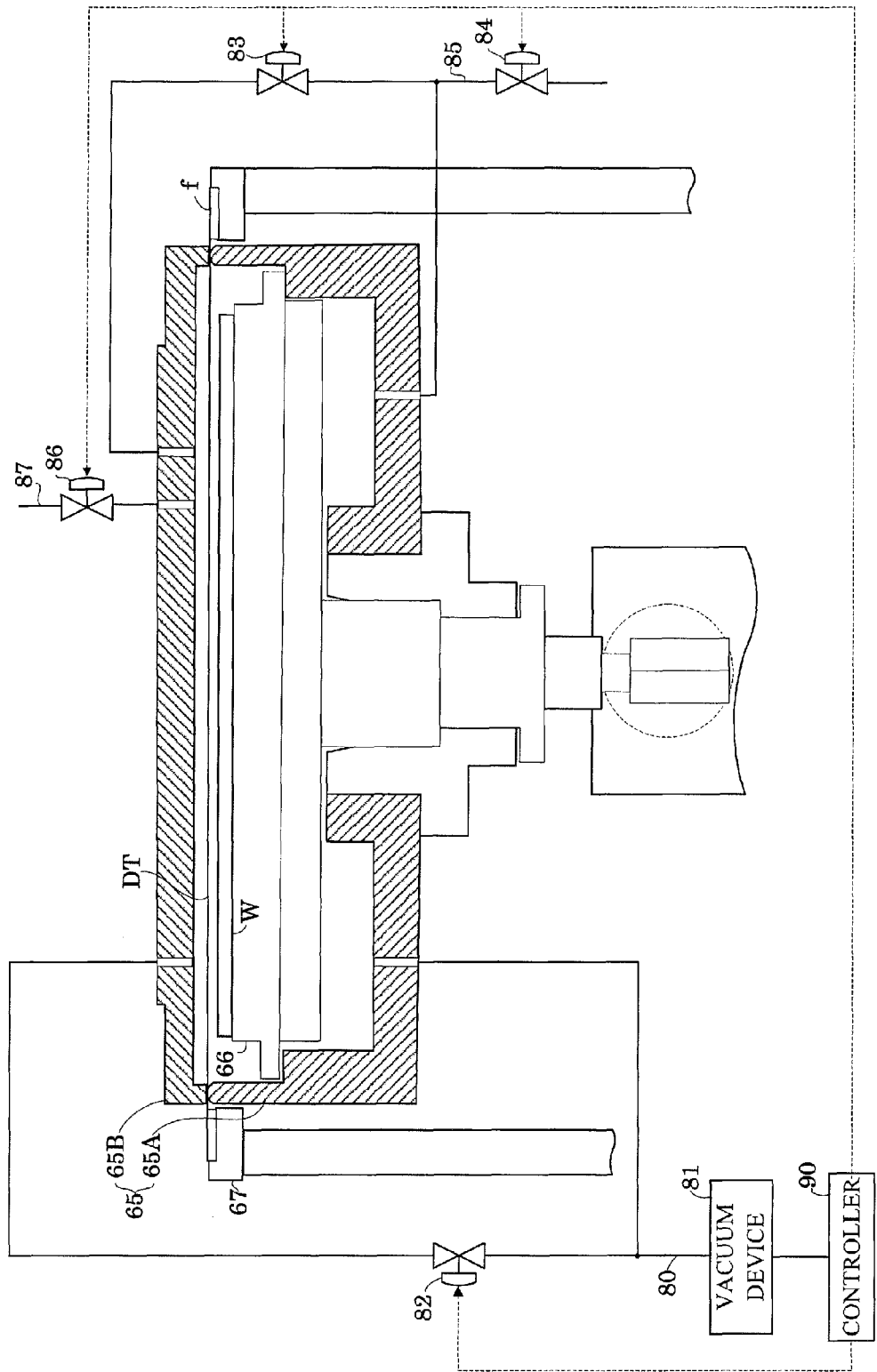
FIG. 8 is a longitudinal sectional view of a chamber.
Figure 9:
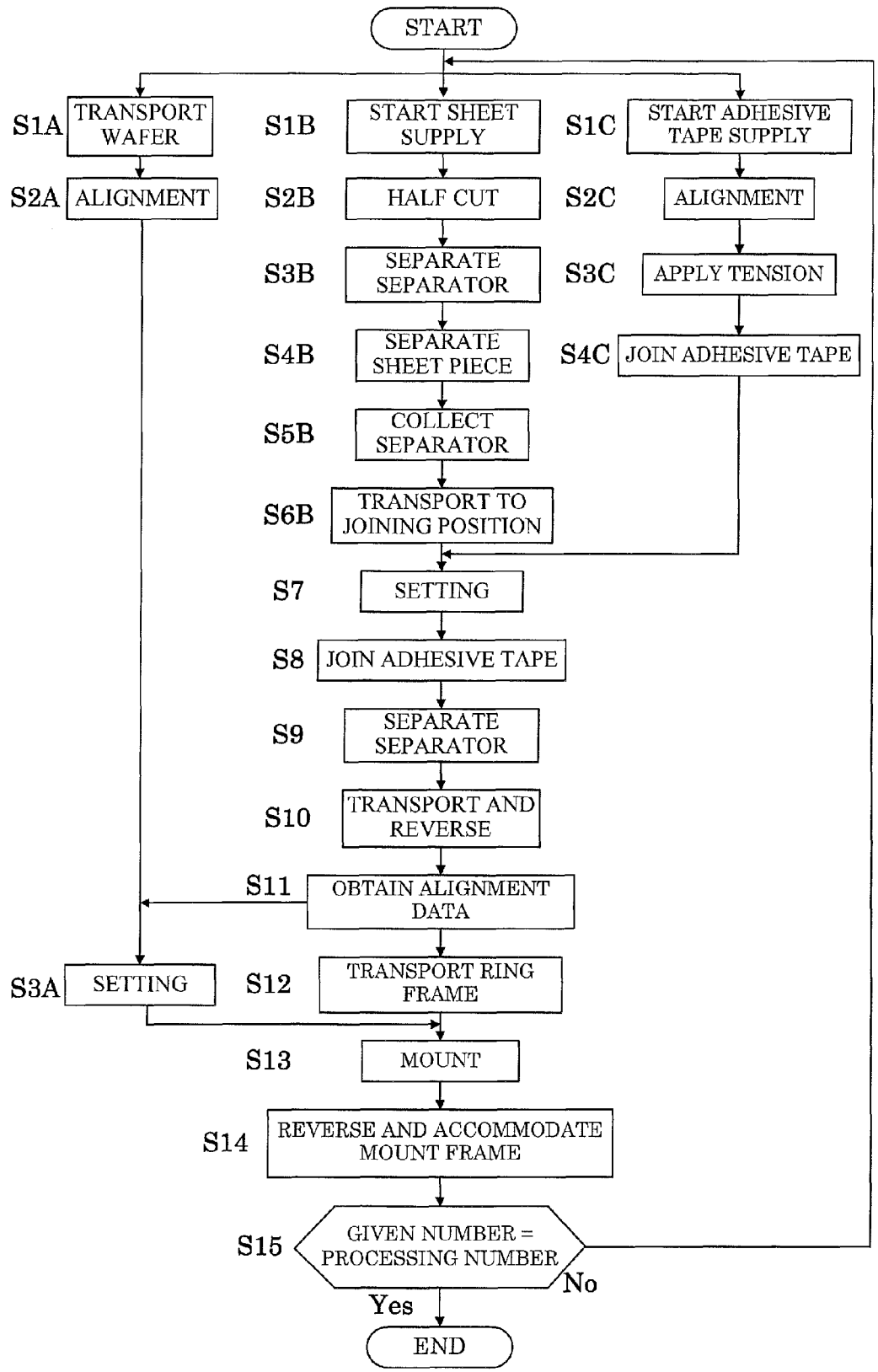
FIG. 9 is a flow chart of operations of the apparatus.

As illustrated in FIG. 8, the upper and lower housings 65A and 65B is in communication with a vacuum device 81 via a channel 80. The channel 80 connected to the upper housing 65B includes an electromagnetic valve 82. The housings 65A and 65B are each in communication with a channel 85 having electromagnetic valves 83 and 84 for air release. The upper housing 65B is also in communication with a channel 87 having an electromagnetic valve 86 configured to control reduced internal pressure through leakage. A controller 90 opens and closes the electromagnetic valves 82, 83, 84, and 86, and operates the vacuum device 81.

The frame holding table 67 is annular surrounding the lower housing 65A. The frame holding table 67 has a level such that a joining surface of the lower housing 65A is flush with a top face of the ring frame f when the ring frame f is placed on the frame holding table 67.

Now referring again to FIG. 3, the wafer supplying section 11 includes a cassette C1. The cassette C1 accommodates multiple wafers W held horizontally in a stack manner.

The wafer transport mechanism 12 includes a robot arm 91. The robot arm 91 can move forward and backward horizontally, and can pivot and move upward and downward entirely. The robot arm 91 includes at a tip end thereof a vacuum-suction wafer holder in a U-shape. The wafer holder is inserted between the wafers accommodated in the cassette C1 in a stack manner to suction-hold the wafer W with a support surface thereof. The suction-held wafer W is pulled out from the cassette C1, and transported to the alignment stage 93 of the wafer aligner 13 and the wafer holding table 66 in this order.

The wafer aligner 13 has an alignment stage 93. A notch or an orientation mark is detected from the periphery edge of the wafer W placed on the alignment stage 93 by the wafer transport mechanism 12. Based on detection results, alignment is performed to the wafer W.

The cassette C2 is placed on the frame collector 14. The cassette C2 accommodates the manufactured mount frames MF in a stack manner, the frames being held horizontally with the surface of the support board 2 directed downward.

The semiconductor wafer mounting apparatus according to the embodiment of the present invention is configured as above. The wafer W is mounted on the ring frame f having the adhesive sheet piece CT joined to the adhesive tape DT with the mounting apparatus. Such a series of these operations are to be described with reference to a flow chart in FIG. 9 and FIGS. 10 to 27.

Operating the mounting apparatus causes a wafer supply line, a sheet supply line and an adhesive tape supply line to start parallel processing simultaneously.

First, description will be given of the wafer supply line. The robot arm 91 suction-holds the support board 2 at a tip end thereof and transports the wafer W out of the cassette C1 (step S1A). The robot arm 91 transports the wafer W to the suction pad extending from a holding surface of the alignment stage 93. The alignment stage 93 aligns the wafer W by determining the center of the wafer W in accordance with the notch formed in the wafer W while suction-holding the support board 2 with the suction pad (step S2A). After the alignment, the robot arm 91 again suction-holds the wafer W lifted from a suction surface with the suction pad, and is transported to the lower housing 65A.

As illustrated in FIG. 10, the wafer holding table 66 receives the wafer W with the support board 2 directed downward by pushing up a plurality of support pins 95 to be higher in level than the top of the lower housing 65A (joining portion). The support pins 95 receiving the wafer W moves downward. The wafer holding table 66 suction-holds the wafer W at the holding surface thereof (step S3A). At this time, the rear face of the wafer W having protruding electrodes 3 formed thereon is lower in level than the joining portion of the lower housing 65A. Moreover, the wafer W is placed on the wafer holding table 66 in accordance with alignment data, to be described later, such that the center of the adhesive sheet piece CT to be joined conforms to the center of the wafer W.

The sheet supply line performs the following processes. The tape supply mechanism 16 reels and supplies the strip adhesive sheet T (step S1B). The adhesive sheet T with the separator S is half-cut into a circular adhesive sheet piece CT on the separator S by a rotatable cutting roller 23 during passing between the cutting roller 23 and the receiving roller 24 of the sheet cutting mechanism 17 (step S2B).

The half-cut adhesive sheet T is supplied to an undesired sheet collector 19 via a dancer roller 18. During this process, the sheet feed roller 28 separates the undesired adhesive sheet CT' with the adhesive sheet pieces CT cut out therefrom, and the undesired sheet collector 19 reels and collects the undesired adhesive sheet CT' to the collection bobbin 29 (step S3B).

The separator S on the rear face with the adhesive sheet pieces CT remaining thereon is supplied to the sheet separating mechanism 20. The sheet separating mechanism 20 stops the adhesive sheet piece CT on the separating member 31 through catching the adhesive sheet T by the dancer roller 18 when the adhesive sheet piece CT reaches the separation position as illustrated in FIG. 11. Simultaneously, as illustrated in FIG. 12, the sheet suction table 33 of the suction transport mechanism 32 moves downward to contact the adhesive sheet piece CT and start suction.

Figure 13:
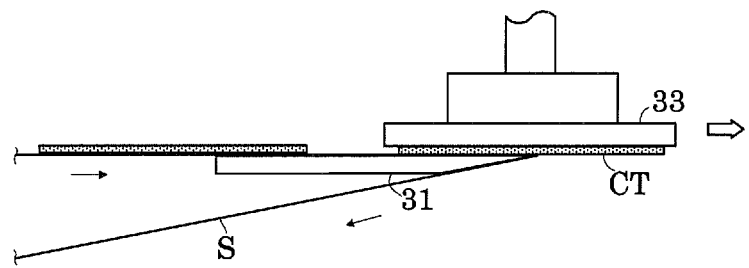

When the sheet suction table 33 suction-holds the adhesive sheet piece CT, the dancer roller 18 operates to feed the adhesive sheet T again. At this time, as illustrated in FIG. 13, the sheet suction table 33 moves the sheet suction table 33 at a speed synchronized with a feeding speed of the adhesive sheet T.

The sheet suction table 33 suction-holds only the adhesive sheet piece CT from which the separator S is separated by the separating member 31 (step S4B). Simultaneously, the separator collecting mechanism 21 reels and collects the separator S to the bobbin (step S5B).

The sheet suction table 33 moves upward while holding the adhesive sheet piece CT to reach above the joining position adjacent to the adhesive tape supply line (step S6B).

Figure 14:
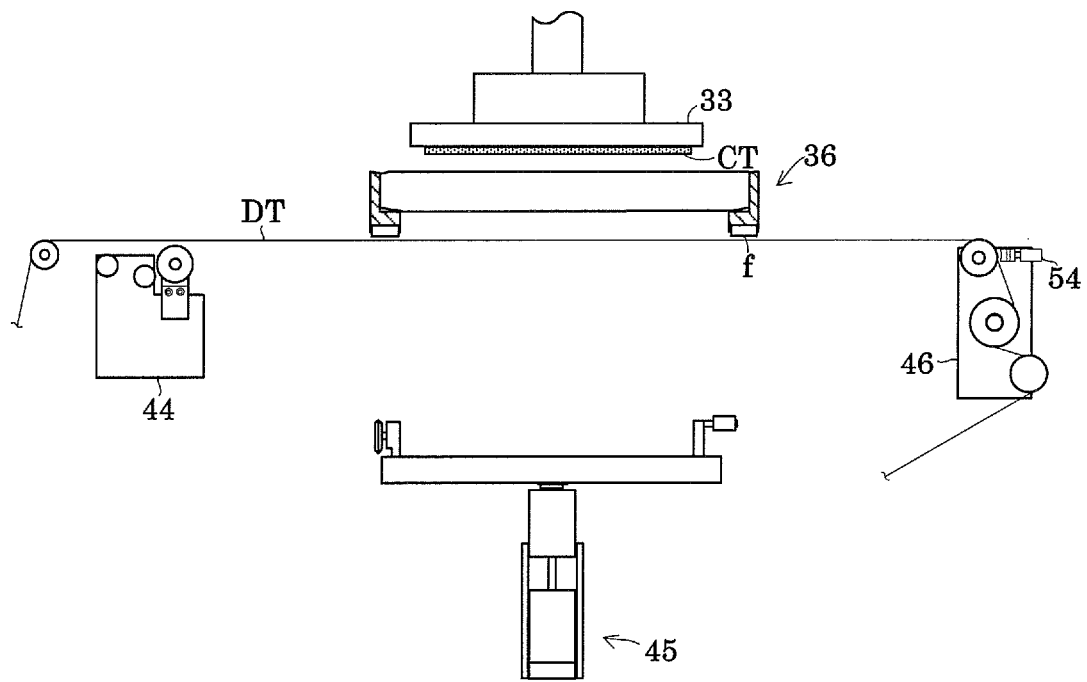
FIGS. 14 to 17 each illustrate operations of joining the adhesive tape to a ring frame.

The adhesive tape supply line performs the following processes. The frame transport mechanism 36 suction-holds the ring frame f to pick up the ring frame f from the frame supplying section 35 (step S1C). The frame transport mechanism 36 performs alignment to the ring frame f while suction-holding the ring frame f (step S2C). Thereafter, the frame transport mechanism 36 transports the ring frame f to a tape joining position as illustrated in FIG. 14. Then, as illustrated in FIGS. 14 to 16, the tension mechanism 43 applies tension in the width direction of the adhesive tape DT to draw the adhesive tape DT. Simultaneously, supply and reeling of the adhesive tape DT causes given tension to be applied longitudinally. In this state, a set of the separation roller 53 and the pusher 54 as well as the pinch roller 47 holds the adhesive tape DT (step S3C). At this time, tension to the adhesive tape DT is set so as not to plastically deform the adhesive tape DT.

Figure 17:
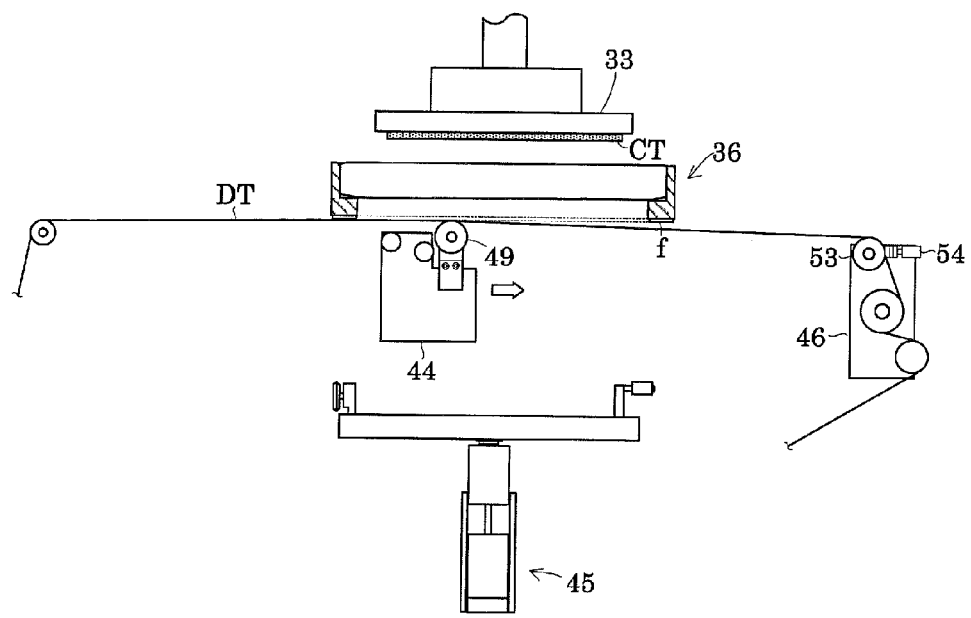

Upon completion of applying tension to the adhesive tape DT, the joining unit 44 operates. Specifically, as illustrated in FIG. 17, the joining roller 49 moves upward to join the adhesive tape DT to the ring frame f while pressing the adhesive tape DT (step S4C).

Figure 18:
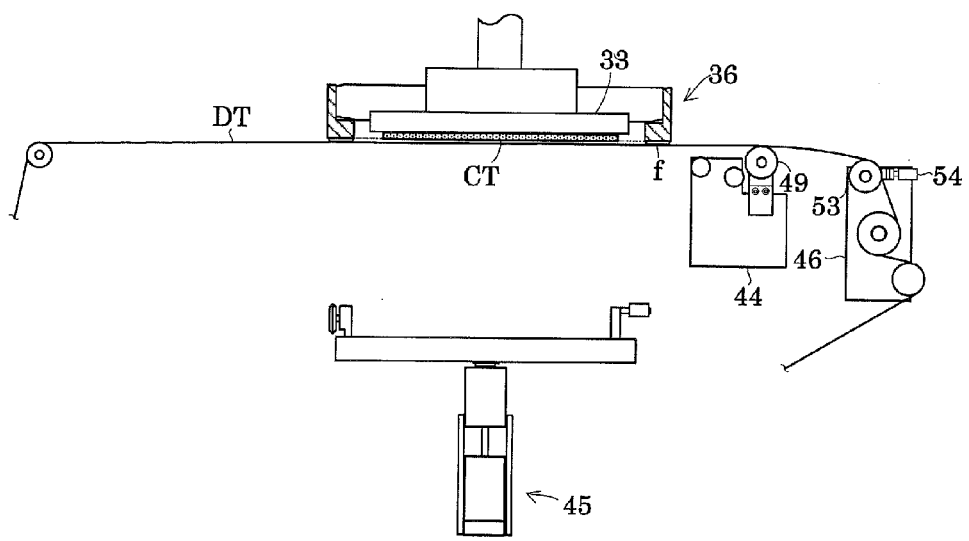
FIGS. 18 to 21 each illustrate operations of joining the adhesive tape to the adhesive sheet piece.

Next, as illustrated in FIG. 18, the sheet suction table 33 of the suction transport mechanism 32 moves the adhesive sheet piece CT downward to an opening of the ring frame f, and adjusts a position and height of the adhesive sheet piece CT such that the adhesive sheet piece CT faces the adhesive tape DT closely (step S7).

Figure 19:
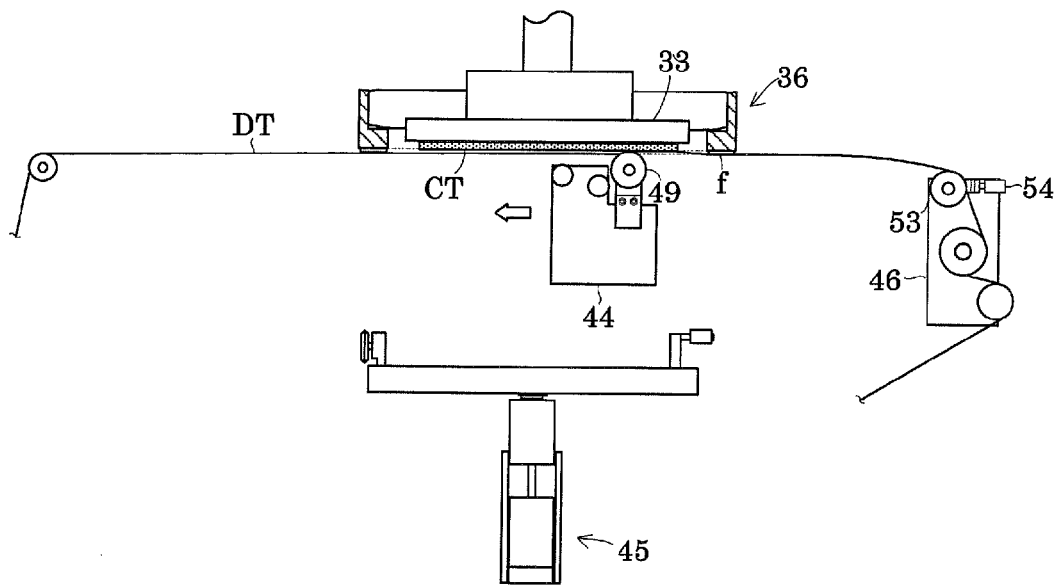

After alignment, as illustrated in FIG. 19, the adhesive tape DT is joined to the adhesive sheet piece CT while being pressed during movement to the standby position with the joining roller 49 of the joining unit 44 remaining in an upward position (step S8).

Figure 20:
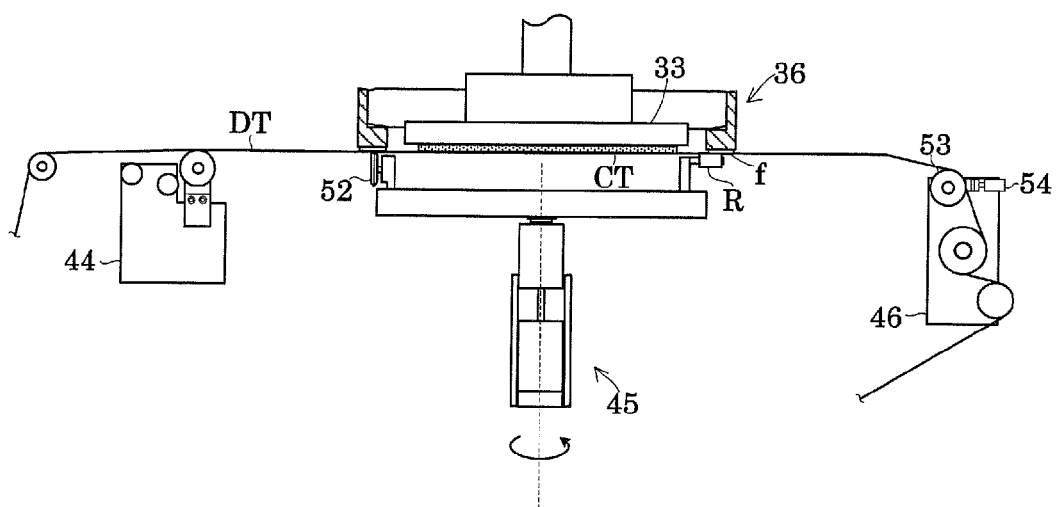

After the adhesive tape DT is joined, as illustrated in FIG. 20, the tape cutting mechanism 45 moves the cutter 52 upward to press it against the adhesive tape DT. In this state, the cutter 52 turns to cut the adhesive tape DT in a shape of the ring frame f. In addition, the press roller R rolls along a cut portion of the adhesive tape DT along with movement of the cutter 52 to join a floating portion. After cutting the adhesive tape DT, the cutting mechanism 45 causes the cutter 52 to return to its standby position below.

Figure 21:
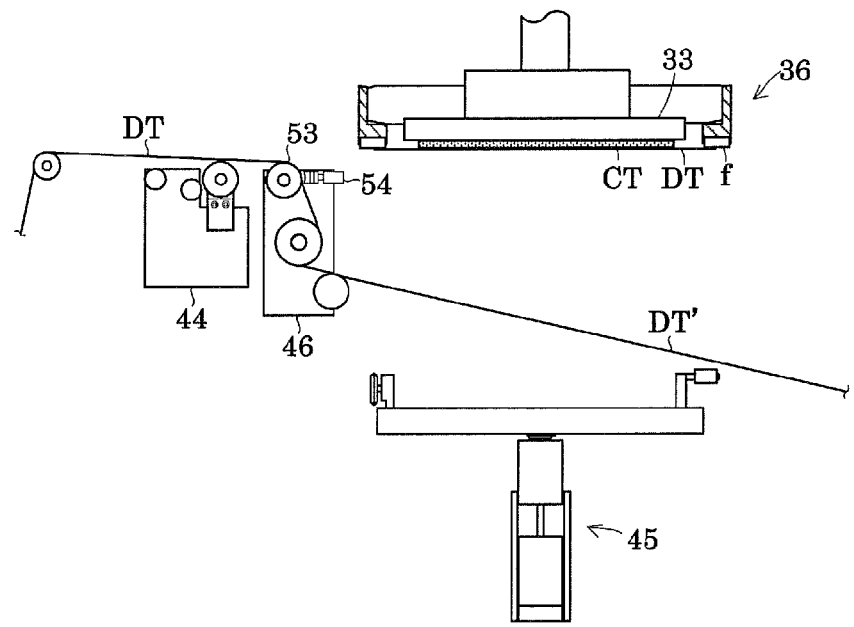

Thereafter, the separation unit 46 releases the pusher 54. As illustrated in FIG. 21, the separation unit 46 separates the cut adhesive tape DT from the ring frame f while moving to an initial position of the joining unit 44 (step S9).

Figure 22:
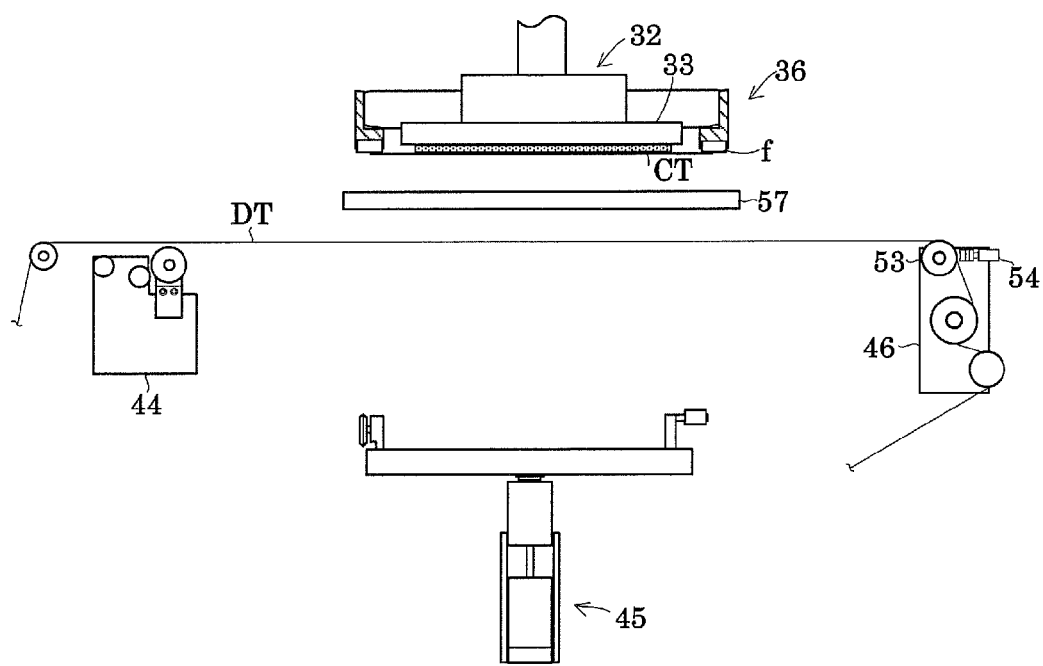
FIGS. 22 to 23 each illustrate transporting the ring frame.

After the undesired adhesive tape DT' is separated, the separation unit 46 returns to the initial position. In addition, as illustrated in FIG. 22, the suction transport mechanism 32 and the frame transport mechanism 36 move upward to a given level and then stop.

Figure 23:
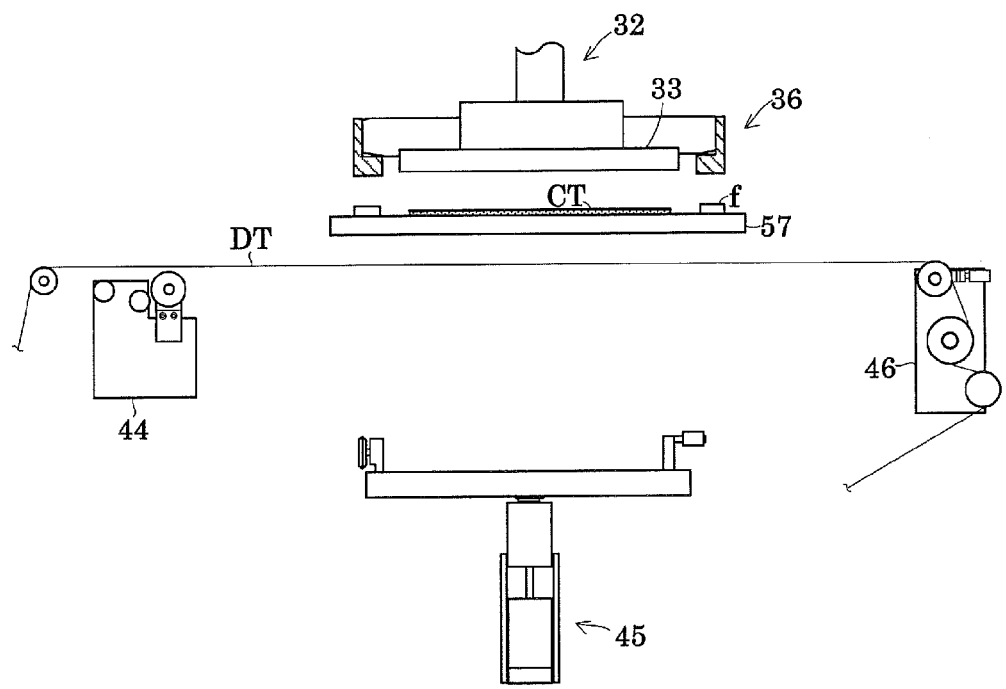

The separation table 57 enters between the adhesive tape DT and a set of the suction transport mechanism 32 and the frame transport mechanism 36 to stop at a given position. Thereafter, the suction transport mechanism 32 and the frame transport mechanism 36 move downward. As illustrated in FIG. 23, the suction transport mechanism 32 and the frame transport mechanism 36 deliver the ring frame f with the adhesive tape DT and the adhesive sheet to the separation table 57. The separation table 57 moves to the separation position of the separator separating mechanism 7 while suction-holding the ring frame f.

Figure 24:
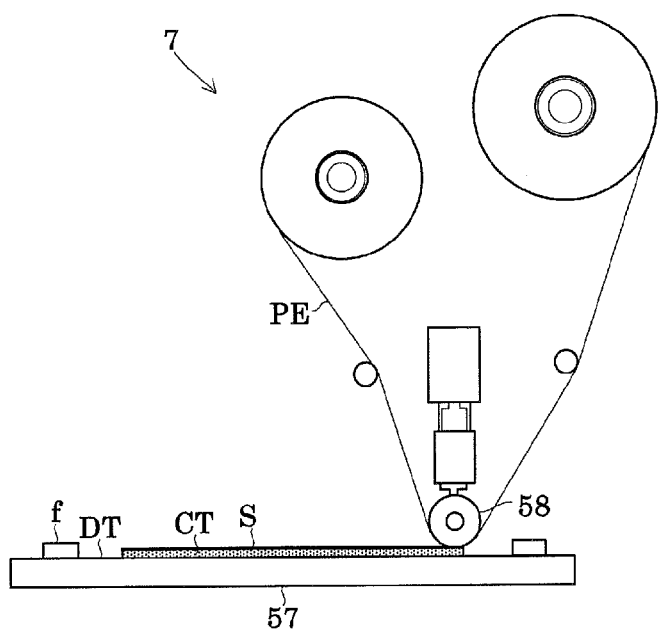
FIGS. 24 and 25 each illustrate separating a separator.
Figure 25:
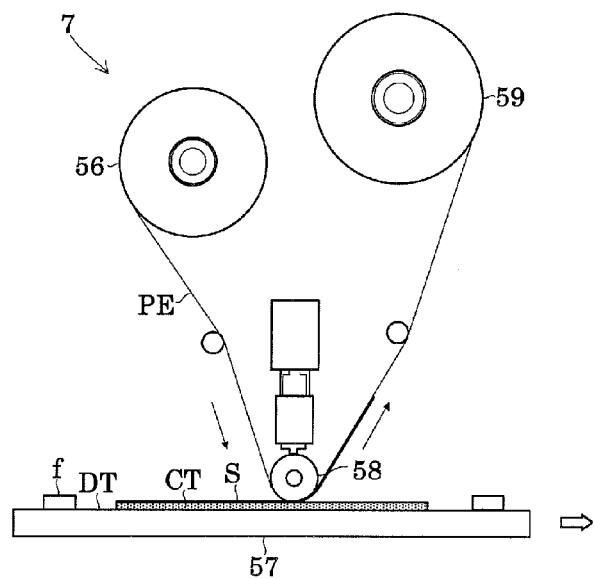

The separation roller 58 moves downward to one end of the adhesive sheet piece CT to join the separation tape PE as illustrated in FIG. 24. Thereafter, as illustrated in FIG. 25, the separation table 57 moves, and the tape collector 59 reels and collects the separator S integrated with the separation tape PE while the tape supplying section 56 supplies the separation tape PE at the same speed as the movement speed of the separation roller 58 (step S9).

Figure 26:
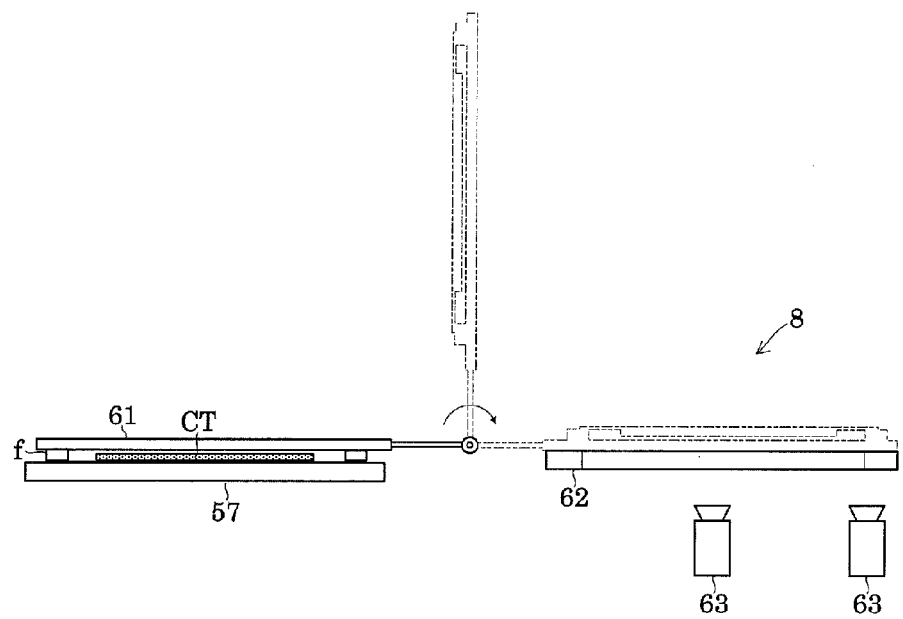
FIG. 26 illustrates transporting the ring frame.

After separation of the separator S from the adhesive sheet piece CT, the separation table 57 moves to the frame aligner 8 as illustrated in FIG. 26. The reversing arm 61 reverses when suction-holds the ring frame f on the separation table 57, whereby the ring frame f is horizontally held on the alignment stage 62 of the frame aligner 8 (step S10).

The two imaging apparatus 63 image the ring frame f and the adhesive sheet piece CT from a ring frame f side. The controller 64 performs pattern matching between data of the actual obtained image and that of the reference image to determine a deviation amount of center coordinates of the ring frame f and the adhesive sheet piece (step S11). The robot arm 91 operates in accordance with the obtained deviation amount to place the wafer W on the wafer holding table 66 such that the center of the wafer W on the wafer holding table 66 conforms to the center of the adhesive sheet piece CT.

After obtaining the data for alignment, the frame transport mechanism 9 suction-holds the ring frame f and transports it to the frame holding table 67 (step S12).

Figure 27:
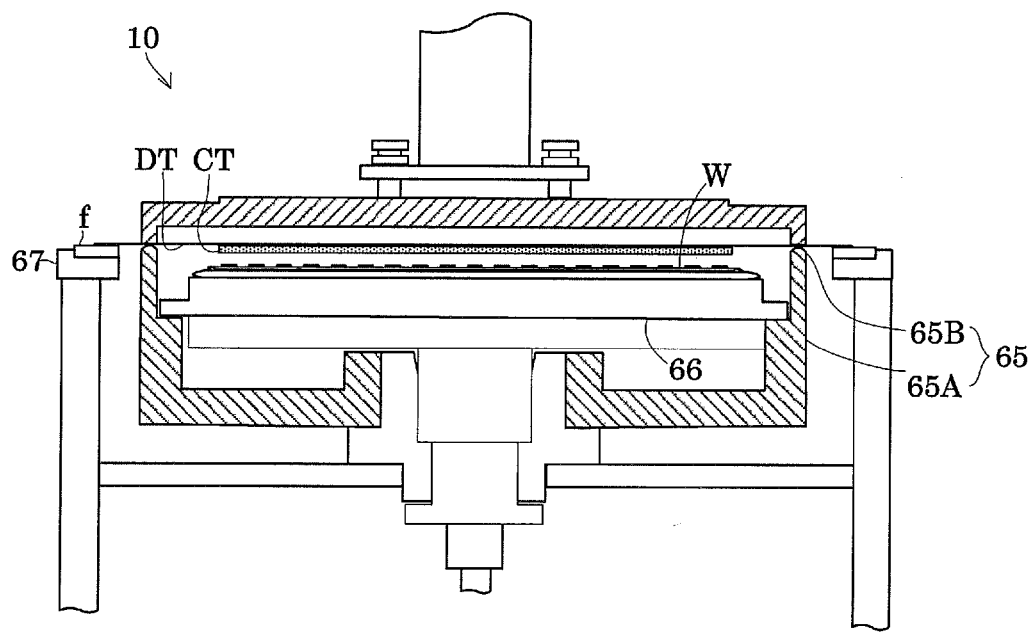
FIGS. 27 and 28 each illustrate operation of mounting the wafer on the adhesive sheet piece.

When the wafer W and the ring frame f are placed on the wafer holding table 66 and the frame holding table 67, respectively, the upper housing 65B moves downward to sandwich the adhesive tape DT with the lower housing 65A to form a chamber 65 as illustrated in FIG. 27.

The controller 90 operates the vacuum device 81 with the electromagnetic valves 83, 84 and 86 closed to reduce pressure within the upper and lower housing 65B and 65A. At this time, opening of the electromagnetic valve 82 is adjusted such that both pressure within the housings 65A and 65B is reduced at the same speed.

When the pressure within the both housings 65A and 65B is reduced, the controller 90 closes the electromagnetic valve 82 and stops operation of the vacuum device 81.

Figure 28:
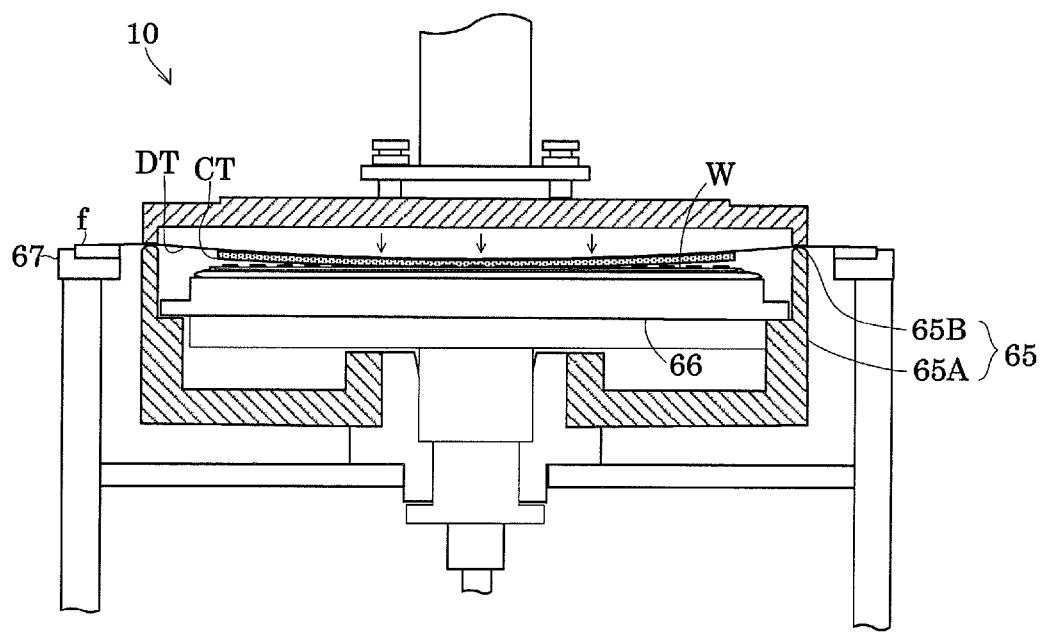

The controller 90 controls opening of the electromagnetic valve 86 to gradually increase air pressure within the upper housing 65B to a given value with leakage. At this time, air pressure within the lower housing 65A is lower than that within the upper housing 65B. This differential pressure causes the adhesive tape to be caught from the center of the adhesive tape to the interior of the lower housing 65A. Specifically, the adhesive tape DT and the adhesive sheet piece CT cave and bend toward the adjacent wafer W as illustrated in FIG. 28, and are gradually joined from the center toward the periphery edge of the wafer W. Here, the adhesive sheet piece CT is drawn to have the shape of the wafer along with caving and bending of the adhesive tape DT, thereby being joined to the entire rear face of the wafer W.

When the pressure within the upper housing 65B reaches a value set in advance, the controller 90 controls the opening of the electromagnetic valve 84 to make the air pressure of the lower housing 65A equal to that of the upper housing 65B. The controller 90 moves the wafer holding table 66 upward in accordance with the controlled air pressure to make the joining portion of the lower housing 65A flush with the rear face of the adhesive tape DT.

Figure 29:
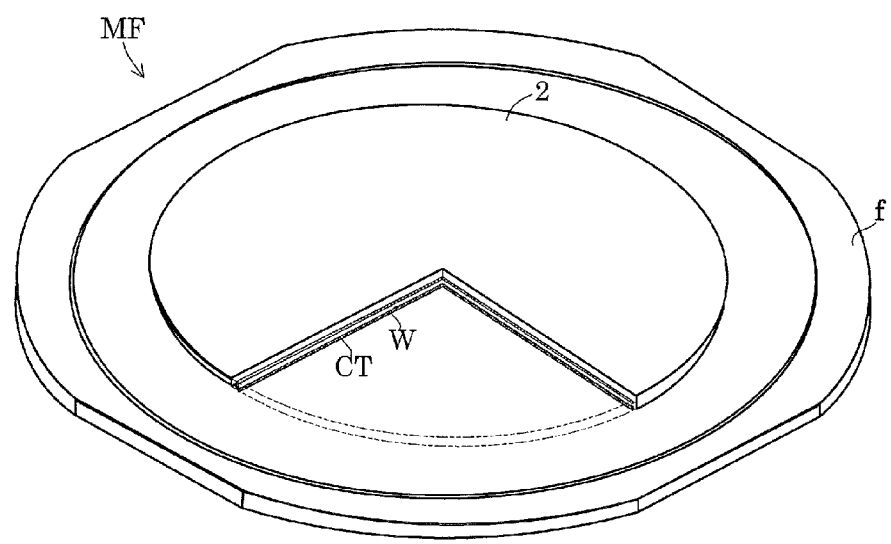
FIG. 29 is a perspective view of a partially cut-out mount frame.
Figure 30:
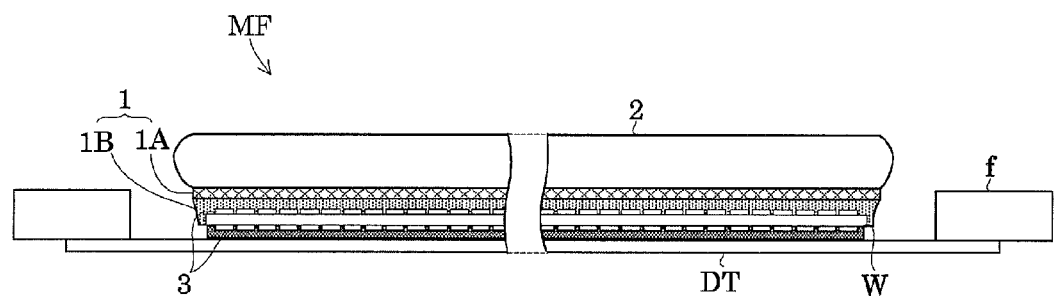
FIG. 30 is a longitudinal sectional view of the mount frame.

The controller 90 moves the upper housing 65B to make air release within the upper housing 65B. In addition, the controller 90 fully opens the electromagnetic valve 84 to make air release within the lower housing 65A. At this time the mount frame MF is manufactured (step S13). That is, as illustrated in FIGS. 29 and 30, the adhesive sheet piece CT is joined between the adhesive tape DT and the wafer W without protruding from the periphery edge of the wafer W.

The manufactured mount frame MF is transported and reversed by a transport mechanism 96, and is accommodated in the cassette C2 with the support board 2 thereof being directed upward (step S14).

As noted above, a series of processes is completed, and the processes are repeatedly performed until a given number of wafers are processed (step S15).

According to the apparatus mentioned above, the adhesive sheet piece CT is joined to the adhesive tape DT, and thereafter is joined to the wafer W within the chamber 65 with the use of the differential pressure. Accordingly, the adhesive sheet piece CT caves and bends toward the wafer W together with the adhesive tape DT. Specifically, a vertex of the caved and bent adhesive sheet piece CT contacts the center of the wafer W and the adhesive sheet piece CT is joined to the rear face of the wafer W radially from the vertex as the starting point. Consequently, the adhesive sheet piece CT is joined while air between the protruding electrodes on the rear face of the wafer W is discharged outside. This causes no air bubble to be caught on the joining surface.

Moreover, the cut adhesive sheet piece CT having the outer shape smaller than that of the wafer W is joined to the rear face of the wafer W. Accordingly, the adhesive sheet piece CT is never joined to the adhesive layer 1 or the support board 2 beyond the periphery edge of the wafer W. This eliminates separation errors upon separation of the support board 2 or the adhesive layer 1.

Moreover, the adhesive sheet piece CT caves and bends when joined to the rear face of the wafer W. This causes the adhesive sheet piece CT to be drawn to have an outer shape same as that of the wafer W. Accordingly, the adhesive sheet piece CT has no area not joined to the rear face of the wafer W. This eliminates contamination of the rear face of the chip around the periphery edge of the wafer W during the dicing process and also eliminates scattering of the diced chips.

The present invention may be modified as under.

(1) In the above embodiment, the strip adhesive sheet T is half-cut. Alternatively, an original master roll having pre-cut adhesive sheet pieces CT may be used. In addition, an adhesive tape DT cut in advance in a circular shape may be used. Consequently, combination of a strip adhesive sheet T and an adhesive tape DT or combination of a pre-cut adhesive sheet T and an adhesive tape DT may be adopted.

Moreover, a strip adhesive tape DT having a plurality of adhesive sheet pieces CT joined in advance at given pitches may be used. When the adhesive tape DT is applied to the apparatus mentioned above, the following mount process is to be performed.

The adhesive tape DT is set in the tape supplying section 41. When the adhesive tape DT is joined to the ring frame f, tension is also applied to the adhesive sheet piece CT along with tension application to the adhesive tape DT. In other words, the adhesive tape DT can be joined to the ring frame f while the adhesive sheet piece CT is drawn to have the same shape as the wafer W.

The ring frame f having the adhesive tape DT with the adhesive sheet piece CT joined thereto is transported to the separating mechanism 7 to separate the separator S from the adhesive sheet piece CT. Thereafter, similar to the above embodiment, the ring frame f is aligned by the frame aligner 8, and is transported to the mount frame producing section 10.

Figure 31:
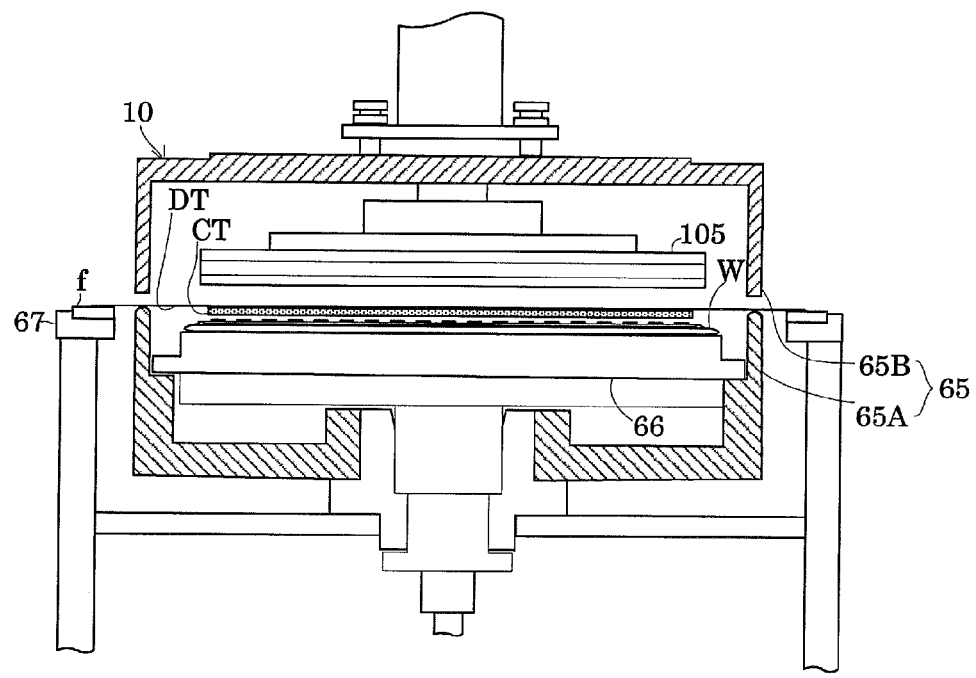
FIG. 31 is a longitudinal sectional view of a chamber according to one modification.
Figure 32:
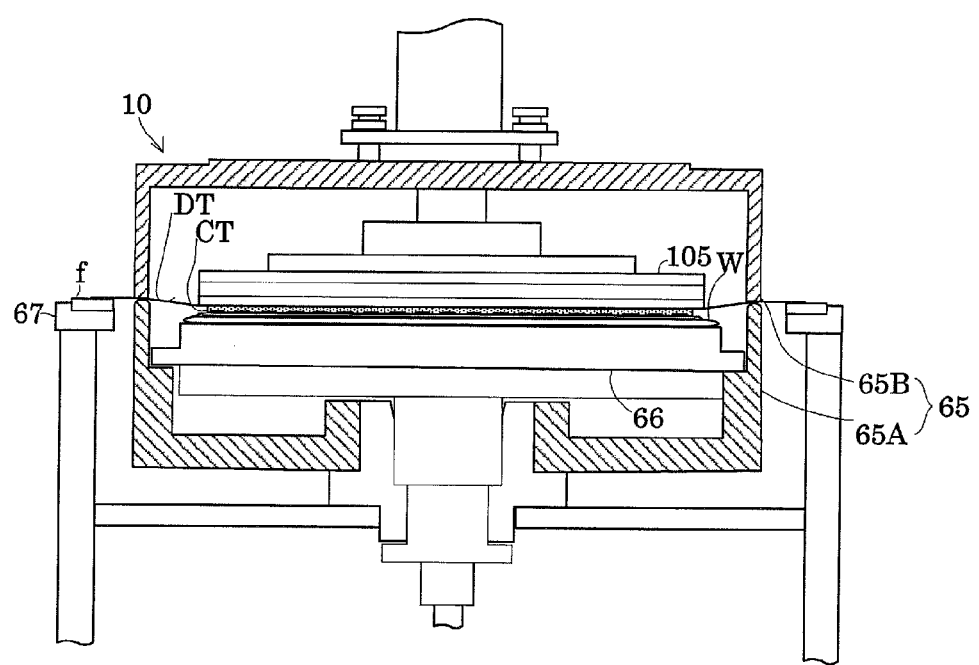
FIG. 32 illustrates operation of mounting a wafer on an adhesive sheet within a chamber of the apparatus according to the modification.

As illustrated in FIG. 31, the mount frame producing section 10 includes inside the upper housing 65 a plate joining member 105 that allows upward and downward movement. Such the construction forms a chamber 65 by moving the upper housing 65B downward when the ring frame f is placed on the frame holding table 67. Thereafter, air pressure within both the spaces divided by the adhesive tape DT is reduced to have the same value while the joining member 105 presses the adhesive tape DT to join the adhesive sheet piece CT to the wafer W as illustrated in FIG. 32. Thereafter, the pressure within the chamber 65 is returned to atmospheric pressure and the chamber is open. Then, the transport mechanism 96 transports the mount frame MF and reverses the frame MF upstream to house it in the frame collector 14.

Such the construction needs no drawing of the adhesive sheet piece CT upon joining the wafer W to the adhesive sheet piece CT. This facilitates control of pressure within the chamber.

Here, the joining member within the chamber 65 is not limited to a plate, but may be a roller, for example.

In the apparatus according to the modification, the adhesive tape DT is joined to the ring frame f while tension is applied to the adhesive tape DT. Thereafter, the sheet piece CT having the same dimension as the wafer W is joined to the adhesive tape DT and then the adhesive sheet piece CT is joined to the wafer W. Such may be adopted. The adhesive sheet piece CT may be joined to the wafer W by a joining member with use of the chamber 65 under reduced pressure, or may be joined while the joining member presses the adhesive tape DT with the chamber 65 being opened.

Such the construction is applicable to the adhesive sheet piece CT hard to be elasticity deformed.

(2) In the above modification, the adhesive sheet piece CT may be joined to the wafer W under a vented condition. For instance, the adhesive sheet piece CT is joined to the adhesive tape DT, and thereafter faces to the adhesive tape DT closely with the center of the adhesive sheet piece CT conforming to the center of the wafer W through the alignment process. A roller covered with an elastic body rolls on the rear face of the adhesive tape DT to press the adhesive sheet piece CT with the rear face of the adhesive tape DT, thereby joining the adhesive sheet piece CT to the rear face of the wafer W.

(3) In the above embodiment, the sheet supplying section 5 may perform alignment to the half-cut adhesive sheet piece CT to join the adhesive sheet piece CT to the adhesive tape DT. For instance, a camera of an optical sensor, for example, images the adhesive sheet piece CT to determine the center of the adhesive sheet piece CT from the obtained image results. Then, the suction transport mechanism 32 suction-holds the adhesive sheet piece CT such that the center of the mechanism 32 conforms to the center of the adhesive sheet piece CT, and then transports the adhesive sheet piece CT to the joining position. Similarly, the center of the ring frame f is determined, and the adhesive tape DT is aligned with the ring frame f to be joined to the ring frame f and the adhesive sheet piece CT.

(4) In the apparatus of the modification, a heater is provided within the chamber 65. The adhesive sheet piece CT is joined to the rear face of the wafer W while being heated with the heater. Such may be adopted. Here, a heating temperature is within a range where the adhesive sheet piece CT is appropriately softened and the adhesive sheet piece CT remains uncured.

(5) In the apparatus according to the modification, the chamber 65 may accommodate the ring frame f entirely.

(6) In the apparatus according to the embodiment, the undesired adhesive sheet T is separated after half cut during transportation to the sheet separating mechanism 20. Alternatively, the sheet separating mechanism 20 may reel and collect the undesired adhesive sheet T together with the separator S.

(7) In the apparatus according to the embodiment, a joining roller that joins the adhesive tape DT to the ring frame f may be different from a joining roller that joins the adhesive sheet piece CT to the adhesive tape DT. For instance, a joining roller having a diameter larger than the internal diameter of the ring frame f may be used for joining the adhesive tape DT to the ring frame f, and a joining roller having a diameter larger than that of the adhesive sheet piece CT and smaller than the internal diameter of the ring frame f may be used for joining the adhesive sheet piece CT.

Such the construction causes the joining roller to move within the ring frame f. This makes it easy to press the adhesive sheet piece CT and to join the adhesive sheet piece CT to the adhesive tape DT.

What is claimed is:

1. A semiconductor wafer mounting method of mounting a semiconductor wafer, which has a surface with protruding electrodes formed thereon, with a support board on a supporting adhesive tape joined to a ring frame by inserting a reinforcing adhesive sheet between the surface of the semiconductor wafer with protruding electrodes formed thereon and the supporting adhesive tape, the method comprising:
    drawing the adhesive tape and joining the adhesive tape to the ring frame, and thereafter mounting the semiconductor wafer on the adhesive tape by inserting the adhesive sheet having, an outer shape equal to or smaller than that of the semiconductor wafer between the semiconductor wafer and the adhesive tape,
    the semiconductor wafer being joined to the supporting board via a two-layered adhesive layer with the surface of the semiconductor wafer with the protruding electrodes formed thereon being joined to the adhesive layer in a non-cured state.

2. The semiconductor wafer mounting method according to claim 1, wherein
    when the adhesive sheet is smaller than the semiconductor wafer, the adhesive sheet is joined to the adhesive tape, and thereafter the adhesive sheet is joined together to the semiconductor wafer while being drawn together with the adhesive tape to have the same shape as the semiconductor wafer.

3. The semiconductor wafer mounting method according to claim 2, wherein
    a pair of housings sandwiches a portion of the adhesive tape joined to the ring frame between the ring frame and the semiconductor wafer, and
    the adhesive sheet on the adhesive tape closely faces to the semiconductor wafer within a chamber formed by connecting both of the housings, and the adhesive sheet is joined to the semiconductor wafer with air pressure in a space within the chamber containing the semiconductor wafer being lower than that of the other space.

4. A semiconductor wafer mounting method of mounting a semiconductor wafer, which has a surface with protruding electrodes formed thereon, with a support board on a supporting adhesive tape joined to a ring frame by inserting a reinforcing adhesive sheet between the surface of the semiconductor wafer with protruding electrodes fanned thereon and the supporting adhesive tape, the method comprising:
    a first joining step of joining the adhesive sheet, having an outer shape smaller than an outer shape of the semiconductor wafer, to the adhesive tape;
    a second joining step of drawing the adhesive sheet together with the adhesive tape so as to have the outer shape of the semiconductor wafer and joining the adhesive sheet to the ring frame; and a mount step of mounting the semiconductor wafer on the adhesive tape by inserting the adhesive sheet between the semiconductor wafer and the adhesive tape, the semiconductor wafer being joined to the supporting board via a two-layered adhesive layer with the surface of the semiconductor wafer with the protruding electrodes formed thereon being joined to the adhesive layer in a non-cured state.

5. The semiconductor wafer mounting method according to claim 4, wherein in the mount step, at least the semiconductor wafer is accommodated in the chamber, and the semiconductor wafer is mounted on the adhesive tape via the adhesive sheet while a joining member presses the adhesive tape under a reduced pressure.

\* \* \* \* \*